US009136035B2

(12) United States Patent
Itou et al.

(10) Patent No.: US 9,136,035 B2
(45) Date of Patent: Sep. 15, 2015

(54) FLEXIBLE CONDUCTIVE MATERIAL AND TRANSDUCER, FLEXIBLE WIRING BOARD, AND ELECTROMAGNETIC SHIELD USING THE SAME

(75) Inventors: Takamasa Itou, Aichi-ken (JP); Jun Kobayashi, Komaki (JP); Hitoshi Yoshikawa, Komaki (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 149 days.

(21) Appl. No.: 13/489,860

(22) Filed: Jun. 6, 2012

(65) Prior Publication Data
US 2012/0241689 A1 Sep. 27, 2012

Related U.S. Application Data

(63) Continuation of application No. PCT/JP2011/073423, filed on Oct. 12, 2011.

(30) Foreign Application Priority Data

Oct. 13, 2010 (JP) ................................ 2010-230614
Mar. 9, 2011 (JP) ................................ 2011-051365

(51) Int. Cl.
*H01B 1/20* (2006.01)
*H01B 1/22* (2006.01)
*H01B 1/24* (2006.01)
(Continued)

(52) U.S. Cl.
CPC .. *H01B 1/22* (2013.01); *C08K 3/04* (2013.01); *H01B 1/24* (2013.01); *H01L 41/0805* (2013.01); *H01L 41/113* (2013.01); *H05K 1/0373* (2013.01); *H05K 1/0256* (2013.01);
(Continued)

(58) Field of Classification Search
USPC ......................................................... 252/511
See application file for complete search history.

(56) References Cited

U.S. PATENT DOCUMENTS 4,775,585 A 10/1988 Hagiwara et al.
5,807,507 A 9/1998 Hirano et al.
(Continued)

FOREIGN PATENT DOCUMENTS

JP 63-054013 3/1988
JP 8-250380 9/1996
(Continued)

OTHER PUBLICATIONS

English text machine translation of Kobayashi et al., JP 10-245528 A, accessed on the AIPN website, attached as a PDF.*
(Continued)

*Primary Examiner* — Harold Pyon
*Assistant Examiner* — Katie L Hammer
(74) *Attorney, Agent, or Firm* — Greenblum & Bernstein, P.L.C.

(57) ABSTRACT

A flexible conductive material includes an elastomer, a conductive agent filled in the elastomer, and an adsorbent fixed inside the elastomer and able to adsorb ionic material. With the flexible conductive material, ionized impurities are unlikely to transfer to an adherend such as a dielectric film. Thus, leakage current during application of voltage decreases. Accordingly, by forming an electrode and a wiring with the flexible conductive material, leakage current can be reduced, and a transducer and a flexible wiring board having excellent durability can be produced. In addition, using the flexible conductive material, an electromagnetic shield can be produced having a small leakage current.

14 Claims, 11 Drawing Sheets

(51) Int. Cl.
*H02N 11/00* (2006.01)
*H05K 1/02* (2006.01)
*H05K 9/00* (2006.01)
*H01L 41/08* (2006.01)
*H01L 41/113* (2006.01)
*H05K 1/03* (2006.01)
*C08K 3/04* (2006.01)
*H05K 1/16* (2006.01)

(52) U.S. Cl.
CPC ....... *H05K 1/162* (2013.01); *H05K 2201/0133* (2013.01); *H05K 2201/0323* (2013.01)

(56) References Cited

U.S. PATENT DOCUMENTS

| | | | | |
|---|---|---|---|---|
| 2003/0114350 | A1* | 6/2003 | Schmitt et al. | 510/466 |
| 2006/0105158 | A1 | 5/2006 | Fritz et al. | |
| 2008/0056766 | A1* | 3/2008 | Furuya | 399/176 |
| 2008/0202336 | A1 | 8/2008 | Hofer et al. | |
| 2009/0015270 | A1* | 1/2009 | Hayakawa et al. | 324/686 |
| 2009/0152510 | A1* | 6/2009 | Ito | 252/511 |
| 2010/0222208 | A1* | 9/2010 | Matsuoka et al. | 502/159 |

FOREIGN PATENT DOCUMENTS

| | | |
|---|---|---|
| JP | 10-120904 | 5/1998 |
| JP | 10-188672 | 7/1998 |
| JP | 10-245528 | 9/1998 |
| JP | 2001-216977 | 8/2001 |
| JP | 2003-107932 | 4/2003 |
| JP | 2005-512804 | 5/2005 |
| JP | 2008-527059 | 7/2008 |
| JP | 2009-227985 | 10/2009 |
| JP | 2009-296703 | 12/2009 |
| WO | 01/06579 | 1/2001 |

OTHER PUBLICATIONS

English text machine translation of Maeda et al., JP 2001-216977 A, accessed on the AIPN website, attached as a PDF.*

Search report from International Application No. PCT/JP2011/073423, mail date is Jan. 31, 2012.

* cited by examiner

Voltage OFF

Voltage ON

During Extension

During contraction

FLEXIBLE CONDUCTIVE MATERIAL AND TRANSDUCER, FLEXIBLE WIRING BOARD, AND ELECTROMAGNETIC SHIELD USING THE SAME

CLAIM OF PRIORITY

This application is a continuation of PCT/JP2011/073423 filed Oct. 12, 2011, and claims the priority benefit of Japanese Applications No. 2010-230614, filed Oct. 13, 2010, and No. 2011-051365, filed Mar. 9, 2011, the contents of which is expressly incorporated by reference in its entirety.

FIELD OF THE INVENTION

The present invention relates to a flexible conductive material which is favorable for an extendable and contractible electrode, a wiring, and the like, and to a transducer, a flexible wiring board, and an electromagnetic shield using the same.

BACKGROUND OF THE INVENTION

Using a polymer material such as a dielectric elastomer, development has advanced for small, light-weight transducers having a high degree of flexibility. Examples of a transducer include an actuator in which a pair of electrodes is disposed on both a front and back surface of a dielectric film made from an elastomer (see, for example, Patent Documents 1 and 2). In an actuator of this type, when the applied voltage between the electrodes is increased, an electrostatic attraction between the electrodes increases. Therefore, the dielectric film sandwiched between the electrodes is compressed in a thickness direction and the thickness of the dielectric film decreases. When the film thickness decreases, the dielectric film proportionally extends in a horizontal direction with respect to the electrode surfaces. Meanwhile, when the applied voltage between the electrodes is reduced, the electrostatic attraction between the electrodes decreases. Therefore, the compressive force on the dielectric film in the thickness direction is reduced, and the film thickness increases due to an elastic restorative force of the dielectric film. When the film thickness increases, the dielectric film proportionally contracts in the horizontal direction with respect to the electrode surfaces. In this way, the actuator drives drive target members by extension and contraction of the dielectric film in response to the magnitude of the applied voltage.

In the actuator, the electrodes are affixed to both the front and back surfaces of the dielectric film. Accordingly, the electrodes must be extendable and contractible in response to deformation of the dielectric film so as not to interfere with the extension and contraction thereof.

RELATED ART

Patent Literature

Patent Document 1: Japanese Patent Publication No. 2003-506858
Patent Document 2: Japanese Patent Laid-open Publication No. 2009-296703

SUMMARY OF THE INVENTION

Problems to be Solved by the Invention

The extendable and contractible electrodes can, for example and as disclosed in Patent Document 2, be formed from a flexible conductive material in which a conductive agent such as carbon black is included in an elastomer. However, when an elastomer is used, impurities in the elastomer are a negative feature. For example, in the case of sulfur cross-linking, unreacted sulfur, vulcanization accelerators, and the like as well as products (reaction residue) of sulfur, vulcanization accelerators, and the like commonly remain in the elastomer after cross-linking. Further, even a rubber polymer raw material contains reaction residues such as initiators, emulsifiers, and chain transfer agents added during a polymerization reaction. These reaction residues are impurities in the elastomer. Accordingly, when an electrode is formed on a surface of a dielectric film from a flexible conductive material containing the elastomer described above, there is a possibility that impurities in the electrode (flexible conductive material) may ionize and transfer to the dielectric film. Further, in a case where a metallic powder (e.g., silver powder) is used as the conductive agent, there is a possibility that ionized silver ($Ag^+$) may transfer to the dielectric film and be deposited as silver (migration).

There is a further possibility that impurities contained in a member (such as a dielectric film) touching the flexible conductive material may, after transferring to the flexible conductive material, transfer once more to the member. These impurities may be, for example, zinc salt and iron salt of dimethyldithiocarbamate used as a cross-linking promoter; sodium salt and zinc salt of 2-mercaptobenzothiazole; hydrolysate of an organic phosphate compound of tricresylphosphate and the like used as a plasticizer and fire retardant; quaternary ammonium salt derived from a surfactant; and various other metallic ions ($Na^+$, $K^+$, $Mg^{2+}$) contained in trace amounts. Thus, the influence of impurities contained in the member touching the flexible conductive material cannot be ignored.

According to investigations by the inventors of the present invention, it was verified that when a pre-cross-linking flexible conductive material is coated on a dielectric film, also prior to cross-linking, and the flexible conductive material and the dielectric film are integrally cross-linked, impurities from the flexible conductive material are more likely to transfer to the dielectric film.

When the ionized impurities transfer through the dielectric film, electrical resistance of the dielectric film is reduced. Therefore, when voltage is applied, electric current flows through the dielectric film more easily (so-called leakage current increases). Accordingly, electric charge is unlikely to be stored at an interface between the dielectric film and the electrode, and power consumption increases. Further, when electric current flows through the dielectric film, Joule heating is produced. There is a possibility that physical properties of the dielectric film may be changed by the heat produced. Moreover, the dielectric film is more likely to break. That is, resistance of the dielectric film to electric breakdown is reduced. When the resistance of the dielectric film to electric breakdown is reduced, a large voltage cannot be applied to the actuator, for example. Accordingly, adequate power and displacement amount cannot be obtained.

Besides actuators, the transfer of impurities is also a negative feature in sensors, power generating elements, and the like in which electrodes are disposed with a dielectric film therebetween. Further, the transfer of impurities also becomes a negative feature in a case where wiring and the like is formed on a surface of an elastic base material such as an elastomer, the wiring and the like being formed from a flexible conductive material containing an elastomer. Specifically, due to the transfer of impurities from the flexible conductive material to the elastic base material, there is a possibility that electrical resistance of the elastic base material may be reduced and leakage current may occur.

The present invention is conceived in light of such conditions, and has as its purpose to provide a flexible conductive material in which the transfer of impurities to an adherend such as a dielectric film is reduced. Further, the present invention has as its purpose to provide a transducer and a flexible wiring board having a small leakage current and excellent durability by forming an electrode and a wiring from the flexible conductive material. Further, the present invention has as its purpose to provide an electromagnetic shield having a small leakage current using the flexible conductive material.

Means for Solving the Problems (1) To resolve the above problem, a flexible conductive material of the present invention includes an elastomer, a conductive agent filled in the elastomer, and an adsorbent fixed inside the elastomer and able to adsorb ionic material.

The adsorbent is incorporated into the flexible conductive material of the present invention. The adsorbent is able to adsorb ionic material. Specifically, the adsorbent can adsorb impurities that have ionized within the elastomer. Further, the adsorbent is fixed inside the elastomer. Therefore, the impurities adsorbed to the adsorbent stay inside the elastomer and do not transfer from the elastomer to the exterior (to another member touching the flexible conductive material). Herein, the adsorbent preferably does not transfer from inside the cross-linked structure (polymer network) of the elastomer to the exterior. Therefore, the adsorbent and the elastomer may be either chemically bonded or not.

In this way, according to the flexible conductive material of the present invention, ionized impurities are unlikely to transfer to another member touching the flexible conductive material. Further, even when an ionized impurity is transferred thereto from the other members touching the flexible conductive material of the present invention, the impurity can be inhibited from transferring once more to the other members. Therefore, in a case where an electrode is formed from the flexible conductive material of the present invention to configure a transducer for an actuator or the like, few impurities transfer from the electrode to the dielectric film. Thus, electrical resistance of the dielectric film is unlikely to be reduced. That is, during application of voltage, electric current is unlikely to flow through the dielectric film. Accordingly, power consumption can be reduced and many electric charges can be stored at an interface between the dielectric film and the electrode. Further, electric current is unlikely to flow through the dielectric film and therefore the production of Joule heating is inhibited. Therefore, the possibility is low that physical properties of the dielectric film will change or that the dielectric film will break due to heat. In this way, according to the flexible conductive material of the present invention, it is possible to achieve an electrode and a wiring in which deformation of the dielectric film is unlikely to be restricted and few impurities transfer to the dielectric film.

(2) A transducer of the present invention includes a dielectric film made of an elastomer, a plurality of electrodes disposed with the dielectric film therebetween, and a wiring connecting each of the plurality of electrodes. At least one of the electrodes and the wiring is configured with the flexible conductive material of the present invention.

The transducer is an apparatus converting energy of a certain type into energy of another type. The transducer contains an actuator, a sensor, a power generating element, and the like converting mechanical energy into electrical energy; alternatively, the transducer contains a speaker, a microphone, and the like converting acoustic energy into electrical energy.

According to the transducer of the present invention, at least one of the electrodes and the wiring (referred to "electrodes and the like" hereafter, where appropriate) is formed from the flexible conductive material of the present invention described above. Accordingly, when the dielectric film deforms, the electrodes and the like extend and contract to follow the deformation. Therefore, the movement of the dielectric film is unlikely to be impeded. Further, few impurities transfer from the electrodes and the like to the dielectric film. Therefore, the possibility is low that the electrical resistance of the dielectric film will be reduced. Accordingly, during application of voltage, electric current is unlikely to flow through the dielectric film. That is, the possibility is low that the physical properties of the dielectric film will change or that the dielectric film will break due to heat. Accordingly, the transducer of the present invention has excellent durability. Further, when the transducer of the present invention is used as an actuator, a large voltage can be applied to the dielectric film. Accordingly, greater power can be generated by increasing the applied voltage.

(3) A flexible wiring board of the present invention includes an elastic base material and a wiring disposed on a surface of the elastic base material. At least a portion of the wiring is configured with the flexible conductive material of the present invention described above.

According to the flexible wiring board of the present invention, the wiring extends and contracts to follow deformation of the elastic base material. Accordingly, the flexible wiring board of the present invention is favorable as wiring for movable components and components having a complex shape. Further, few impurities transfer from the wiring to the elastic base material. Therefore, the possibility is low that the electrical resistance of the elastic base material will be reduced and that electric current will flow into the elastic base material. Therefore, a malfunction is inhibited. Further, the possibility is low that the physical properties of the elastic base material will change and that the elastic base material will break due to Joule heating. In this way, the flexible wiring board of the present invention has excellent durability.

(4) An electromagnetic shield of the present invention is configured with the flexible conductive material of the present invention.

The flexible conductive material of the present invention can be manufactured from a coating material in which a raw material such as a rubber polymer is dissolved in a predetermined solvent. Alternatively, the flexible conductive material of the present invention can be formed in various shapes from a kneaded raw material. Therefore, the flexible conductive material of the present invention is easily disposed as an electromagnetic shield in various positions where shielding from electromagnetic waves is desired. Further, according to the electromagnetic shield of the present invention, impurities in the electromagnetic shield (flexible conductive material) are unlikely to transfer to a member touching the electromagnetic shield. Therefore, the possibility is low that the electrical resistance of the touching member will be reduced, and that leakage current will occur. Accordingly, the possibility is low that the physical properties of the touching member will change and that the member will break due to Joule heating.

DESCRIPTION OF REFERENCE NUMERALS

Figure 1A:
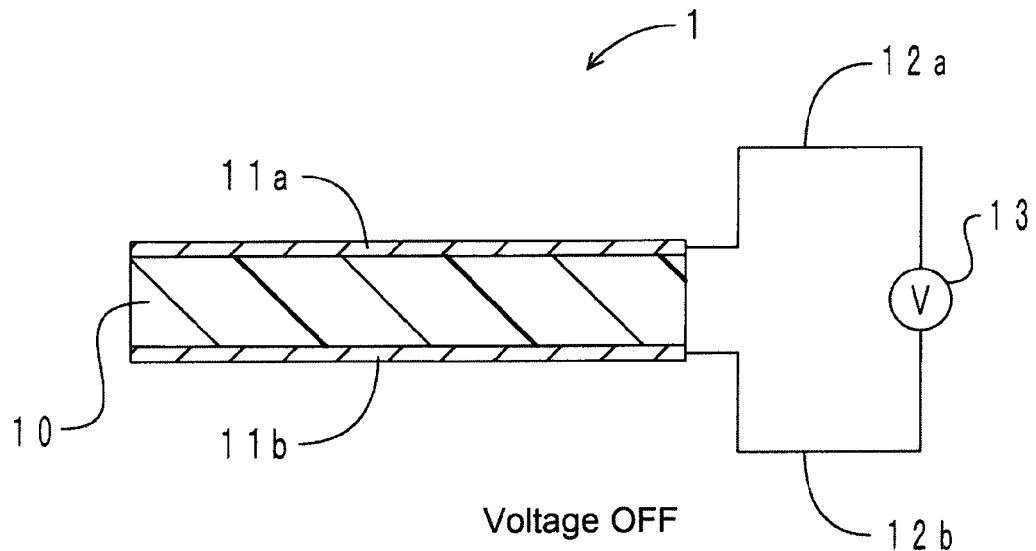
FIGS. 1A and 1B are cross-sectional schematic diagrams of an actuator in a first embodiment of a transducer of the present invention, FIG. 1A showing a voltage OFF state and FIG. 1B showing a voltage ON state.

1: actuator (transducer); 10: dielectric film; 11$a$ and 11$b$: electrode; 12$a$ and 12$b$: wiring; 13: power source; 14$a$ and 14$b$: electrode; 140$a$ and 140$b$: inner conductive layer; 141$a$ and 141$b$: outer conductive layer. 2: capacitance-type sensor (transducer); 20: dielectric film; 21$a$ and 21$b$: electrode; 22$a$ and 22$b$: wiring; 23$a$ and 23$b$: cover film; 24: connector. 3: power generating element (transducer); 30: dielectric film; 31$a$ and 31$b$: electrode; 32$a$-32$c$: wiring. 4: speaker (transducer); 40$a$: first outer frame; 40$b$: second outer frame; 41$a$: first inner frame; 41$b$: second inner frame; 42$a$: first dielectric film; 42$b$: second dielectric film; 43$a$: first outer electrode; 43$b$: second outer electrode; 44$a$: first inner electrode; 44$b$: second inner electrode; 45$a$: first vibration plate; 45$b$: second vibration plate; 430$a$, 430$b$, 440$a$, and 440$b$: terminal; 460: bolt; 461: nut; 462: spacer. 5A: first element for testing; 5B: second element for testing; 50: dielectric film; 51$a$ and 51$b$: electrode; 52: upper chuck; 53: lower chuck; 54$a$ and 54$b$: inner electrode; 55$a$ and 55$b$: outer electrode. 6: flexible wiring board; 60: elastic base material; 61: connector for front wiring; 62: connector for back wiring; 01X-16X: front electrode; 01Y-16Y: back electrode; 01$x$-16X: front wiring; 01$y$-16$y$: back wiring.

MODE FOR CARRYING OUT THE INVENTION

Hereafter, each embodiment of a flexible conductive material, a transducer, a flexible wiring board, and an electromagnetic shield according to the present invention will be described. Further, the flexible conductive material, the transducer, the flexible wiring board, and the electromagnetic shield according to the present invention are not limited by the following embodiments and can be embodied in various forms having modifications, improvements, and the like made by one skilled in the art, within a scope not exceeding the scope of the present invention.

<Flexible Conductive Material>

The flexible conductive material of the present invention includes an elastomer, a conductive agent, and an adsorbent. The type of the elastomer is not particularly limited. In a case where the flexible conductive material is used for an electrode and a wiring of the transducer which includes a dielectric film made of an elastomer, from the perspective of being flexible and easily extended and contracted, an elastomer having an elastic modulus of 10 MPa or less is preferably used. Examples include silicone rubber, ethylene-propylene copolymerized rubber, natural rubber, styrene-butadiene copolymerized rubber, acrylonitrile-butadiene rubber (NBR), hydrogenated acrylonitrile-butadiene rubber (H-NBR), acrylic rubber, epichlorohydrin rubber, chlorosulfonated polyethylene, chlorinated polyethylene, urethane rubber, and a polyurethane series thermoplastic elastomer. Further, as in epoxidized natural rubber, carboxyl group modified hydrogenated nitrile rubber, and the like, an elastomer modified by the introduction of a functional group and the like may also be used. As an elastomer, one kind can be used alone or, alternatively, two or more kinds can be mixed together for use.

When the adsorbent is chemically bonded to the elastomer, the adsorbent can be reliably fixed inside the elastomer. Accordingly, as the elastomer, an elastomer having a functional group and structure capable of reacting with the adsorbent is preferred. For example, as the adsorbent, when a compound having a mercapto group is used, an elastomer is favorable having a functional group and structure capable of reacting with the mercapto group or, alternatively, with another functional group in the compound. Examples include an elastomer having an epoxy group, an isocyanate group, an organic silane compound and the like; an elastomer containing chlorine atoms or bromine atoms (such as hydrin rubber, chloroprene rubber, and chlorinated polyolefin); and an elastomer having a carbon-carbon double bond (C=C).

The type of the conductive agent is not particularly limited. For example, the conductive agent may be appropriately selected from among carbon materials such as carbon black, carbon nanotubes, and graphite; metallic materials such as silver, gold, copper, nickel, rhodium, palladium, chrome, titanium, platinum, iron, and metal alloys thereof; and conductive oxides such as indium tin oxide (ITO) and a conductive oxide in which titanium oxide and zinc oxide are doped with another metal such as aluminum and antimony. One kind of conductive agent may be used alone, and two or more kinds of conductive agent may also be mixed for use. For example, carbon black is favorable for having a high degree of adhesion with a parent material elastomer and for easily aggregating to form conductive pathways. Of these conductive agents, highly conductive carbon blacks such as Ketjen Black and conductive agents which are highly adsorptive of impurities and have fine holes, such as activated carbon and mesoporous carbon, are favorable.

In addition, cladded particles imparted with conductivity by covering particle surfaces with metal may be used. Compared to particles formed of metal only, the mass ratio of cladded particles is small. Accordingly, the cladded particles are unlikely to settle when coated and dispersion improves. Further, by manufacturing the particles, cladded particles having a variety of shapes can be easily produced. As a cladding metal, a metallic material listed previously may be used. Also, carbon materials such as graphite and carbon black; metallic oxides such as calcium carbonate, titanium dioxide, aluminum oxide, and barium titanate; inorganic material such as silica; and resin such as acrylic and urethane may be used for the particles.

An included amount of the conductive agent may be determined such that a desired conductivity is obtained as an electrode and a wiring. For example, from the perspective of ensuring conductivity as an electrode, the included amount of the conductive agent is preferably 0.1% by volume or more where the volume of the flexible conductive material is 100% by volume. 1% by volume or more is more preferable. Meanwhile, when the included amount of the conductive agent becomes greater, flexibility decreases. Therefore, the included amount of the conductive agent is preferably 35% by volume or less where the volume of the flexible conductive material is 100% by volume. 15% by volume or less is more preferable.

The adsorbent is able to adsorb ionic material and may be fixed inside the elastomer. As the adsorbent, for example, materials which are adsorptive of impurities and have fine holes may be used, such as compounds having a mercapto group, ion-exchange polymers, oxides such as silica and alumina, zeolite, activated carbon, and mesoporous carbon. Further, as a material having an ability to exchange positive ions, layered double hydroxides such as hydrotalcite, clay minerals such as montmorillonite, layered titanium oxide, layered silicate, and layered polysilicates such as magadiite, kenyaite, makatite, kanemite, and ilerite can be used. Among these, compounds having a mercapto group, ion-exchange polymers, silica, activated carbon, and mesoporous carbon are favorable. One kind selected from among these may be used alone, or two kinds or more may be mixed together for use.

As a compound having a mercapto group, a compound having a triazine skeleton is preferred. A triazine ring has a $\pi$ conjugate. Accordingly, when a mercapto group is bonded to a 2 position, a 4 position, and a 6 position, for example, acidity is enhanced and thus the adsorption of impurities and reactivity with impurities are enhanced. Examples include trimercaptotriazine (TMT); 4,6-diamino-1,3,5-triazine-2-thiol; 4-amino-1,3,5-triazine-2-thiol; and 2-amino-1,3,5-triazine-4,6-dithiol. Further, a compound supporting TMT in silica gel (Si-TMT) may also be used. When TMT is supported in silica gel, even in a case where an elastomer not chemically bonded to TMT is used, TMT can be fixed inside the elastomer by using the fact that silica gel is fixed in the elastomer.

The ion-exchange polymer may be a polymer having a functional group capable of ion exchange. Examples include an elastomer having a sulfate group and a carboxyl group, which have positive ion exchange capability. A further example is an elastomer having primary through tertiary ammonium groups, which have negative ion exchange capability. These elastomers have a functional group in a main chain or a side chain. The kind of the elastomer is not particularly limited, but is preferably an elastomer which does not undermine flexibility of the flexible conductive material.

Further, as the ion-exchange polymer, an ion-exchange resin can be used. In such a case, the ion-exchange resin may be appropriately selected from positive ion-exchange resins and negative ion-exchange resins known in the common art. The positive ion-exchange resin includes strongly acidic positive ion-exchange resins whose exchange group is a sulfo group and weakly acidic positive ion-exchange resins whose exchange group is a carboxyl group. In consideration of the ion species released when ions inside the elastomer are adsorbed, an H positive ion-exchange resin is preferably used. The negative ion-exchange resin includes a strongly basic negative ion-exchange resin whose exchange group is a quaternary ammonium group and a weakly basic negative ion-exchange resin whose exchange groups are primary through tertiary amino groups. In the case of a strongly basic negative ion-exchange resin, considering the ion species released when ions inside the elastomer are adsorbed, an OH negative ion-exchange resin is preferably used.

The particle diameter for the ion-exchange polymer may be adjusted as appropriate in consideration of film thickness of the electrode and the like formed from the flexible conductive material. For example, a particle diameter for an available ion-exchange resin is several hundred µm and, in a case where an electrode is formed having a film thickness of about 5 to 50 µm, the particle diameter of the ion-exchange resin may be made several µm to tens of µm by a method in which the particles are applied to a sieve following dry milling and frost shattering. Also, in a case where the ion-exchange resin is swollen, the resin is preferably used after drying.

Further, by using a polymer more flexible than the ion-exchange resin, it is also possible to adjust the physical properties of the flexible conductive material. As the flexible polymer, a polymer may be suggested whose glass transition temperature (Tg) is room temperature or below and which has as a main chain acrylic polymer, urethane polymer, polyether, polydiene (such as isoprene and butadiene), and a copolymer of these.

Depending on the manufacturing method, sodium derived from a raw material may remain in the silica. When there is a large amount of sodium residue, there is a possibility that the sodium may ionize and become an impurity. Herein, the amount of sodium residue is correlated with a pH value of the silica. Specifically, when there is a large amount of sodium residue, the pH value tends to become larger. Therefore, when silica is used, silica having the lowest possible pH value is preferably selected. For example, the pH value is preferably 10.5 or less. A pH value of 8.5 or less is favorable, and a value of 6.5 or less even more favorable. In the present specification, as the pH value of the silica, a value measured with the following measurement method is employed. First, the silica is dispersed into water to prepare a dispersion liquid with a silica concentration of 4% by mass. Next, the dispersion liquid is sufficiently agitated, then the pH value of the dispersion liquid is measured with a pH meter.

Activated carbon and mesoporous carbon are conductive. For this reason, activated carbon and mesoporous carbon act not only as the adsorbent but also as the conductive agent. Therefore, in a case where at least one of activated carbon and mesoporous carbon is included as the adsorbent, including no other material as the conductive agent is fine. However, when attempting to obtain a desired conductivity by including only activated carbon and mesoporous carbon, a comparatively large amount must be included. A favorable amount to include, for 100 parts by mass of elastomer, is 20 parts by mass or greater and 50 parts by mass or less. When there is a large amount of activated carbon and mesoporous carbon included, the flexibility of the flexible conductive material is reduced. Therefore, from the perspective of balancing conductivity and flexibility, even in a case where at least one of activated carbon and mesoporous carbon is included, including another material as the conductive agent is preferable.

The amount of the adsorbent may be adjusted as appropriate in response to the kind of compound used. When the amount of the adsorbent included is too low, an adsorbent effect is not adequately obtained with respect to the ionic material. In contrast, when the amount is too high, there is a possibility that the flexible conductive material may become rigid and the flexibility required by the electrode and the wiring may be lost. For example, when TMT is used alone, for 100 parts by mass of the elastomer, the TMT is preferably 0.5 parts by mass or more and 20 parts by mass or less. Further, when one of the H positive ion-exchange resin and the OH negative ion-exchange resin is used alone, for 100 parts by mass of the elastomer, the resin is preferably 1 part by mass or more and 30 parts by mass or less. Also, when silica is used alone, for 100 parts by mass of the elastomer, the silica is preferably 3 parts by mass or more and 20 parts by mass or less. Further, when at least one of activated carbon and mesoporous carbon is used alone as the adsorbent, for 100 parts by mass of elastomer, the adsorbent is preferably 1 part by mass or more and 20 parts by mass or less.

The flexible conductive material of the present invention can be manufactured by cross-linking a rubber compound containing a rubber polymer elastomeric raw material, a conductive agent, and an adsorbent. For the rubber compound, additives such as a cross-linker, a vulcanization accelerator, a processing aid, a plasticizer, an anti-aging agent, a strengthening agent, and a colorant may be included as needed. By performing cross-linking, rubber elasticity is imparted and recovery from extension and contraction is improved. A cross-linking method may be appropriately determined according to the kind of rubber polymer, and the like. Examples include sulfur cross-linking, peroxide cross-linking, isocyanate cross-linking, hydrosilyl cross-linking, epoxy cross-linking, electron beam (EB) cross-linking, and ultraviolet (UV) cross-linking. In addition, an organic metallic compound sol-gel reaction may be used.

For example, in a case where the raw material such as rubber polymer is kneaded by a roller or kneader to prepare the rubber composition, a metal mold may be filled with the prepared rubber composition, which is then pressure cross-linked under predetermined conditions. Alternatively, in a case where the raw material such as rubber polymer is dissolved in a predetermined solvent to prepare the rubber composition, the cross-link may be formed in the following way. First, the prepared rubber composition is coated on a substrate or the like. Next, the coating film is dried and the solvent is volatilized. Then, along with drying of the coating film, or under separate predetermined conditions, a cross-linking reaction is advanced. In either case, when the rubber polymer and the conductive agent are pre-mixed, the dispersion of the conductive agent is improved.

<Transducer>

The transducer of the present invention includes a dielectric film made of an elastomer, a plurality of electrodes disposed with the dielectric film therebetween, and a wiring connected to each of the plurality of electrodes. Using an elastomer with a high specific inductive capacity as the dielectric film is preferred. Specifically, the elastomer preferably has a specific inductive capacity (100 Hz) of 2 or more at a normal temperature, and more preferably of 5 or more. For example, an elastomer having a polar functional group such as an ester group, a carboxyl group, a hydroxyl group, a halogen group, an amide group, a sulfo group, a urethane group, and a nitrile group may be employed. Alternatively, an elastomer may be employed to which a low molecular weight polar compound having these polar functional groups has been added. A favorable elastomer includes a silicone rubber, an acrylonitrile-butadiene rubber (NBR), a hydrogenated acrylonitrile-butadiene rubber (H-NBR), an ethylene-propylene-diene rubber (EPDM), an acrylic rubber, a urethane rubber, an epichlorohydrin rubber, a chlorosulfonated polyethylene, and a chlorinated polyethylene.

The thickness of the dielectric film may be appropriately determined according to the intended use of the transducer, and the like. For example, from the perspective of miniaturization, decreased voltage drive, increasing an amount of displacement, and the like, the thickness of the dielectric film is preferably on the thin side in the case of an actuator. In such a case, in consideration also of electric breakdown and the like, the thickness of the dielectric film is preferably 1 µm or more and 1000 µm (1 mm) or less. The thickness of the dielectric film is more favorable when 5 µm or more and 200 µm or less.

At least one of the electrodes and the wiring is configured with the flexible conductive material of the present invention. The configuration of the flexible conductive material of the present invention and the manufacturing method thereof are as described above. Accordingly, their description is omitted here. In the transducer of the present invention, as well, a favorable embodiment of the flexible conductive material of the present invention described above is preferably employed.

The electrodes and the wiring may be formed from two or more conductive layers of different materials. In such a case, the conductive layer in contact with the dielectric film is preferably formed from the flexible conductive material of the present invention. For example, in the transducer of the present invention, the electrodes have a plurality of laminated conductive layers. An embodiment is favorable in which, among the plurality of conductive layers, at least an inner conductive layer in contact with the dielectric film is configured with the flexible conductive material of the present invention.

In addition, from the perspective of miniaturizing the transducer and minimizing the impact on deformation of the dielectric film as much as possible, the thickness of the electrodes and the wiring is preferably on the thin side. For example, the thickness of the electrodes and the wiring is preferably 0.4 µm or more and 1000 µm or less. The thickness of the dielectric film is more favorable when 5 µm or more and 50 µm or less. Hereafter, as an example of the transducer of the present invention, embodiments of an actuator, a capacitance-type sensor, a power generating element, and a speaker are described.

First Embodiment

Figure 1B:
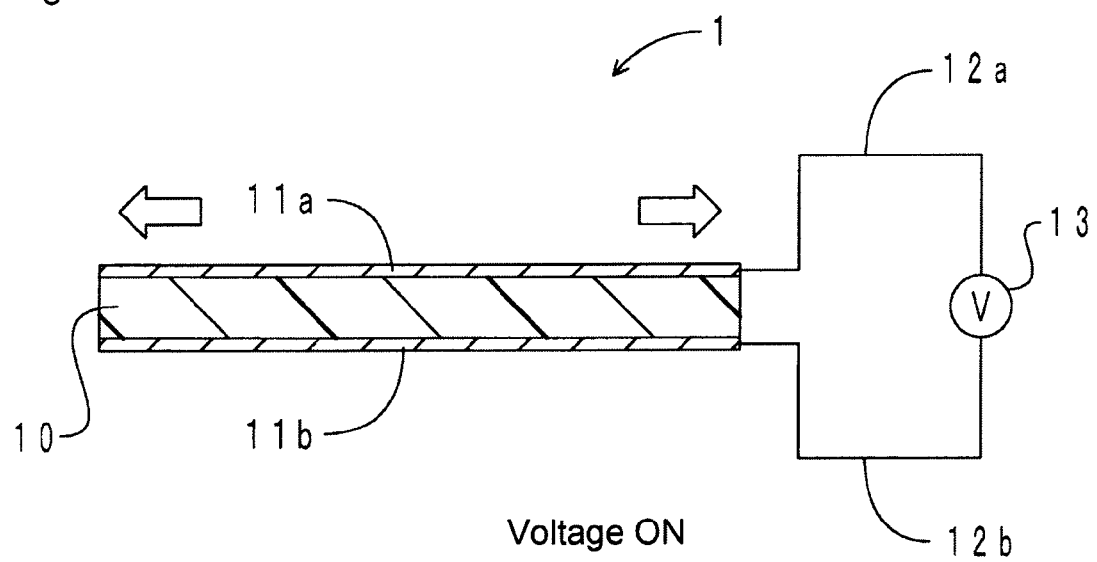

As a first example of the transducer of the present invention, an embodiment of an actuator is described. FIGS. 1A and 1B show cross-sectional schematic diagrams of the actuator in the present embodiment. FIG. 1A shows a voltage OFF state and FIG. 1B shows a voltage ON state.

As shown in FIGS. 1A and 1B, an actuator 1 is provided with a dielectric film 10, electrodes 11a and 11b, and wirings 12a and 12b. The dielectric film 10 is made of H-NBR. The electrode 11a is disposed so as to cover approximately the entire upper surface of the dielectric film 10. Similarly, the electrode 11b is disposed so as to cover approximately the entire lower surface of the dielectric film 10. The electrodes 11a and 11b are connected to a power source 13 by the wirings 12a and 12b, respectively. The electrodes 11a and 11b are both configured with the flexible conductive material of the present invention.

When switching from the OFF state to the ON state, voltage is applied between the pair of electrodes 11a and 11b. By applying voltage, the thickness of the dielectric film 10 decreases and, as shown by whited-out arrows in FIG. 1B, the dielectric film 10 proportionally extends horizontally with respect to the surfaces of the electrodes 11a and 11b. Thereby, the actuator 1 outputs a drive force in an up-down direction and a left-right direction in the drawing.

According to the present embodiment, the electrodes 11a and 11b are flexible, extendable, and contractible. Therefore, the electrodes 11a and 11b can be extended and contracted to follow deformation of the dielectric film 10. Specifically, the movement of the dielectric film 10 is less likely to be impeded by the electrodes 11a and 11b. In addition, according to the present embodiment, ionized impurities are unlikely to be transferred from the electrodes 11a and 11b to the dielectric film 10. Therefore, electrical resistance of the dielectric film 10 is unlikely to be reduced. That is, when voltage is applied, electric current is unlikely to flow through the dielectric film 10. Accordingly, by applying voltage, a large number of electrical charges can be stored at the interface between the dielectric film 10 and the electrodes 11a and 11b. In addition, electric current is unlikely to flow through the dielectric film 10, thus inhibiting the production of Joule heating. Accordingly, the possibility is small that the physical properties of the dielectric film 10 will be changed and that the dielectric film 10 will break due to the heat. In this way, the actuator 1 has excellent durability. In addition, a larger voltage can be applied with the actuator 1. As a result, greater power can be generated.

Figure 11:
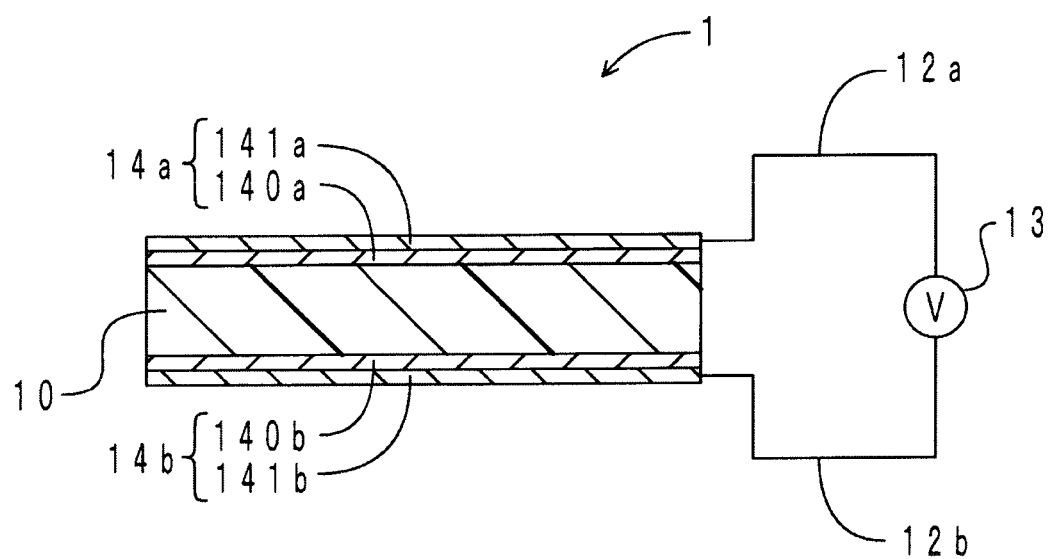
FIG. 11 is a cross-sectional schematic view of an actuator in a fifth embodiment of the transducer of the present invention.

In addition, another embodiment of the actuator includes an embodiment in which an electrode is formed from a plurality of laminated conductive layers. Hereafter, an embodiment in which the electrode is formed from two conductive layers is shown. This embodiment is a fifth embodiment of the transducer of the present invention. FIG. 11 is a cross-sectional schematic view of an actuator in this embodiment (in a voltage OFF state). In FIG. 11, components corresponding to FIG. 1A are shown with the same reference numerals.

As shown in FIG. 11, the actuator 1 is provided with the dielectric film 10, electrodes 14a and 14b, and the wirings 12a and 12b. The electrode 14a is disposed on an upper surface of the dielectric film 10. The electrode 14b is disposed on the lower surface of the dielectric film 10 so as to oppose the electrodes 14a with the dielectric film 10 sandwiched therebetween. The electrode 14a includes an inner conductive layer 140a and an outer conductive layer 141a. The inner conductive layer 140a is disposed so as to cover approximately the entire upper surface of the dielectric film 10. The inner conductive layer 140a is formed from the flexible conductive material of the present invention containing an adsorbent. The outer conductive layer 141a is laminated on an upper surface of the inner conductive layer 140a. The outer conductive layer 141a is formed from a flexible conductive material which includes silver powder in an elastomer (an easily ionizable additive such as a vulcanization accelerator is included as needed, but an adsorbent is not included). The outer conductive layer 141a is connected to the wiring 12a. The wiring 12a is connected to the power source 13.

Similarly, the electrode 14b includes an inner conductive layer 140b and an outer conductive layer 141b. The inner conductive layer 140b is disposed so as to cover approximately the entire lower surface of the dielectric film 10. The inner conductive layer 140b is formed with the flexible conductive material of the present invention containing an adsorbent. The outer conductive film 141b is laminated on a lower surface of the inner conductive layer 140b. The outer conductive layer 141b is formed with a flexible conductive material which includes silver powder with an elastomer (an easily ionizable additive such as a vulcanization accelerator is included as needed, but an adsorbent is not included). The outer conductive layer 141b is connected to the wiring 12b. The wiring 12b is connected to the power source 13.

In the present embodiment, the inner conductive layers 140a and 140b which are in contact with the dielectric film 10 are both configured with the flexible conductive material of the present invention. Therefore, ionized impurities are unlikely to transfer from the electrodes 14a and 14b to the dielectric film 10.

Second Embodiment

Figure 2:
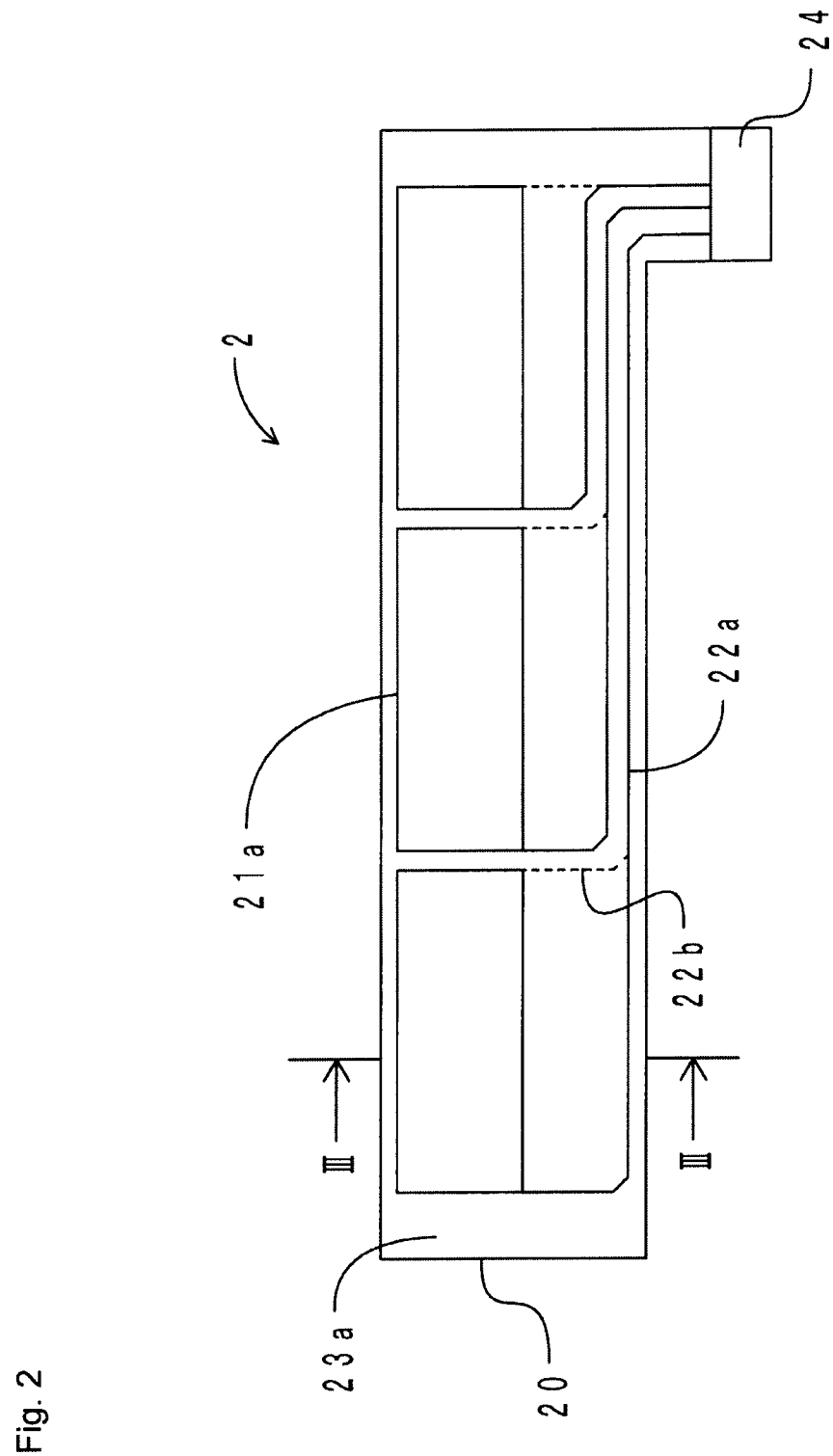
FIG. 2 is a top view of a capacitance-type sensor in a second embodiment of the transducer of the present invention.
Figure 3:
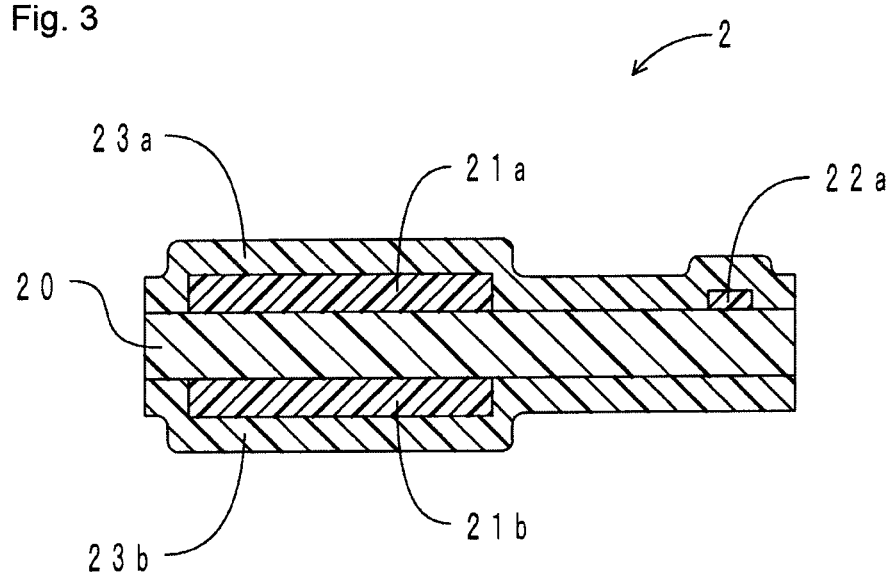
FIG. 3 is a cross-sectional view along a line III-III in FIG. 2.

As a second example of the transducer of the present invention, an embodiment of a capacitance-type sensor is described. First, the configuration of the capacitance-type sensor of the present embodiment is described. FIG. 2 is a top view of the capacitance-type sensor. FIG. 3 is a cross-sectional view along a line III-III in FIG. 2. As shown in FIGS. 2 and 3, a capacitance-type sensor 2 is provided with a dielectric film 20, a pair of electrodes 21a and 21b, wirings 22a and 22b, and cover films 23a and 23b.

The dielectric film 20 is made of H-NBR and has a belt shape extending in a left-right direction. The thickness of the dielectric film 20 is approximately 300 μm.

The electrode 21a has a rectangular shape. Three electrodes 21a are formed by screen printing on an upper surface of the dielectric film 20. Similarly, the electrode 21b has a rectangular shape. Three electrodes 21b are formed on a lower surface of the dielectric film 20 so as to oppose the electrodes 21a with the dielectric film 20 sandwiched therebetween. The electrodes 21b are screen printed on the lower surface of the dielectric film 20. In this way, three pairs of the electrodes 21a and 21b are disposed with the dielectric film 20 sandwiched therebetween. The electrodes 21a and 21b are configured with the flexible conductive material of the present invention.

The wiring 22a is individually connected to each of the electrodes 21a formed on the upper surface of the dielectric film 20. The electrodes 21a and a connector 24 are connected by the wiring 22a. The wiring 22a is formed by screen printing on the upper surface of the dielectric film 20. Similarly, the wiring 22b is individually connected (shown by a dotted line in FIG. 2) to each of the electrodes 21b formed on the lower surface of the dielectric film 20. The electrodes 21b and a connector (not shown) are connected by the wiring 22b. The wiring 22b is formed by screen printing on the lower surface of the dielectric film 20. The wirings 22a and 22b are configured with the flexible conductive material of the present invention.

The cover film 23a is made of acrylic rubber and has a belt shape extending in the left-right direction. The cover film 23a covers an upper surface of the dielectric film 20, the electrodes 21a, and the wiring 22a. Similarly, the cover film 23b is made of acrylic rubber and has a belt shape extending in the left-right direction. The cover film 23b covers the lower surface of the dielectric film 20, the electrodes 21b, and the wiring 22b.

Next, movement of the capacitance-type sensor 2 is described. For example, when pressure is applied to the capacitance-type sensor from above, the dielectric film 20, the electrodes 21a, and the cover film 23a curve downward as a single body. Due to compression, the thickness of the dielectric film 20 decreases. As a result, the capacitance between the electrodes 21a and 21b increases. Due to this capacitance change, deformation due to compression is detected.

Next, an operation effect of the capacitance-type sensor 2 of the present embodiment is described. According to the present embodiment, the dielectric film 20, the electrodes 21a and 21b, the wirings 22a and 22b, and the cover films 23a and 23b are all configured with an elastomer material. Therefore, the entire capacitance-type sensor 2 is flexible, extendable, and contractible. In addition, the electrodes 21a and 21b and the wirings 22a and 22b can deform to follow deformation of the dielectric film 20.

In addition, according to the present embodiment, ionized impurities are unlikely to transfer from the electrodes 21a and 21b and from the wirings 22a and 22b to the dielectric film 20.

Therefore, electrical resistance of the dielectric film 20 is unlikely to be reduced. Electric current is unlikely to flow through the dielectric film 20, and thus the possibility is small that detection accuracy will be reduced. In addition, electric current is unlikely to flow through the dielectric film 20, thus inhibiting the production of Joule heating. Accordingly, the possibility is small that the physical properties of the dielectric film 20 will change or that the dielectric film 20 will break due to the heat. In this way, the capacitance-type sensor 2 has excellent durability. Furthermore, the capacitance-type sensor 2 of the present embodiment is formed with three pairs of electrodes 21a and 21b opposing one another with the dielectric film 20 therebetween. However, the number, size, placement, and so on of the electrodes may be appropriately determined according to an intended use of the capacitance-type sensor 2.

Third Embodiment

Figure 4A:
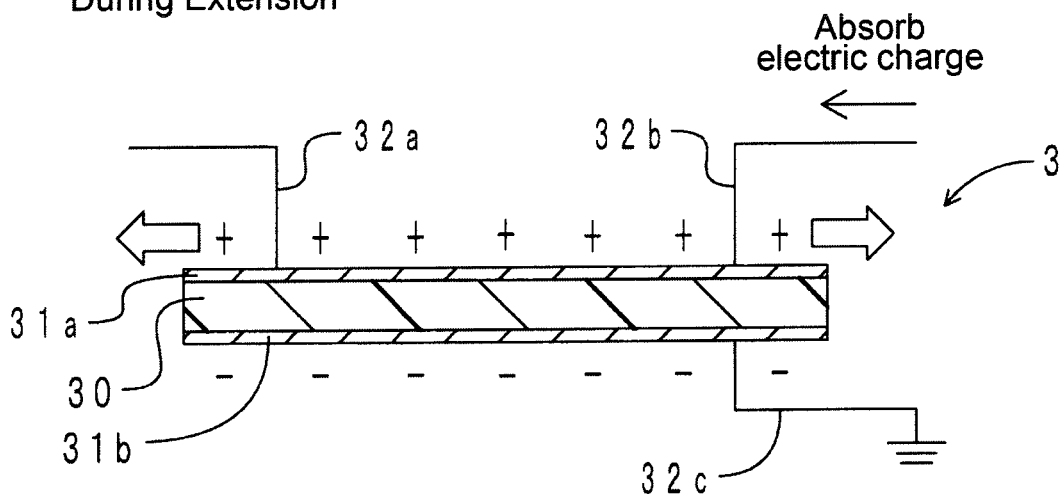
FIGS. 4A and 4B are cross-sectional schematic diagrams of a power generating element in a third embodiment of the transducer of the present invention, FIG. 4A showing the power generating element during extension and FIG. 4B showing the power generating element during contraction.
Figure 4B:
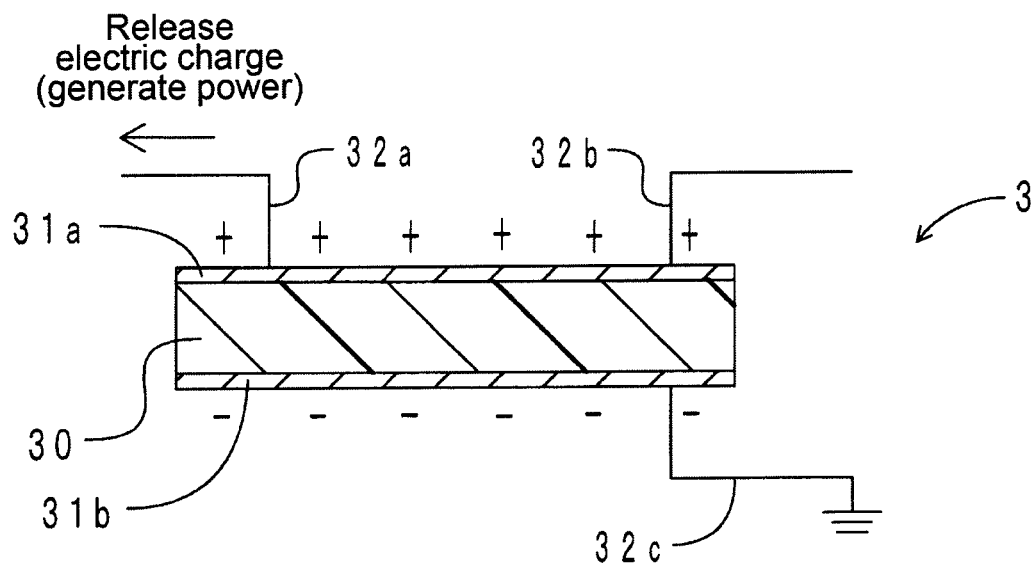

As a third example of the transducer of the present invention, an embodiment of a power generating element is described. FIGS. 4A and 4B are cross-sectional schematic diagrams of the power generating element in the present embodiment. FIG. 4A shows the power generating element during extension and FIG. 4B shows the power generating element during contraction.

As shown in FIGS. 4A and 4B, a power generating element 3 is provided with a dielectric film 30, electrodes 31a and 31b, and wirings 32a to 32c. The dielectric film 30 is made of H-NBR. The electrode 31a is disposed so as to cover approximately an entire upper surface of the dielectric film 30. Similarly, the electrode 31b is disposed so as to cover approximately an entire lower surface of the dielectric film 30. The electrode 31a is connected to the wirings 32a and 32b. Specifically, the electrode 31a is connected to an external load (not pictured) via the wiring 32a. Also, the electrode 31a is connected to a power source (not pictured) via the wiring 32b. The electrode 31b is grounded by the wiring 32c. The electrodes 31a and 31b are both configured with the flexible conductive material of the present invention.

As shown with the whited-out arrows of FIG. 4A, when the power generating element 3 is compressed and the dielectric film 30 is extended horizontally with respect to the surfaces of the electrodes 31a and 31b, the thickness of the dielectric film 30 decreases and electrical charge can be stored between the electrodes 31a and 31b. Thereafter, when the compressive force is removed, as shown in FIG. 4B, the dielectric film 30 contracts due to an elastic restorative force thereof and the film thickness increases. Thereupon, the stored electrical charge is released through the wiring 32a.

According to the present invention, the electrodes 31a and 31b are flexible, extendable, and contractible. Therefore, the electrodes 31a and 31b can be extended and contracted to follow deformation of the dielectric film 30. Specifically, movement of the dielectric film 30 is unlikely to be impeded by the electrodes 31a and 31b. In addition, according to the present embodiment, ionized impurities are unlikely to transfer from the electrodes 31a and 31b to the dielectric film 30. Therefore, the electrical resistance of the dielectric film 30 is unlikely to be reduced. That is, during compression, electric current is unlikely to flow through the dielectric film 30. Accordingly, even in a case where an amount of compression is great, a large number of electrical charges can be stored at the interface between the dielectric film 30 and the electrodes 31a and 31b. Specifically, a large amount of generated power can be obtained with the power generating element 3. Moreover, the possibility is small that the physical properties of the dielectric film 30 will be changed and that the dielectric film 30 will break due to Joule heating. In this way, the power generating element 3 has excellent durability.

Fourth Embodiment

Figure 5:
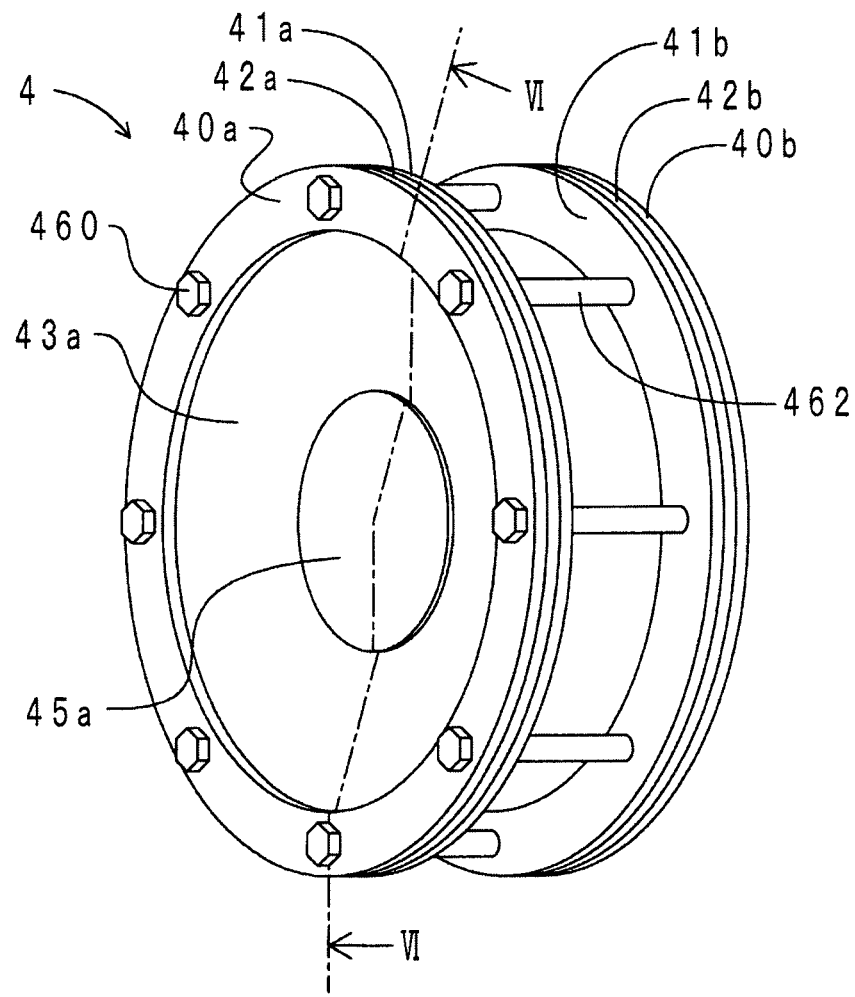
FIG. 5 is a perspective view of a speaker in a fourth embodiment of the transducer of the present invention.
Figure 6:
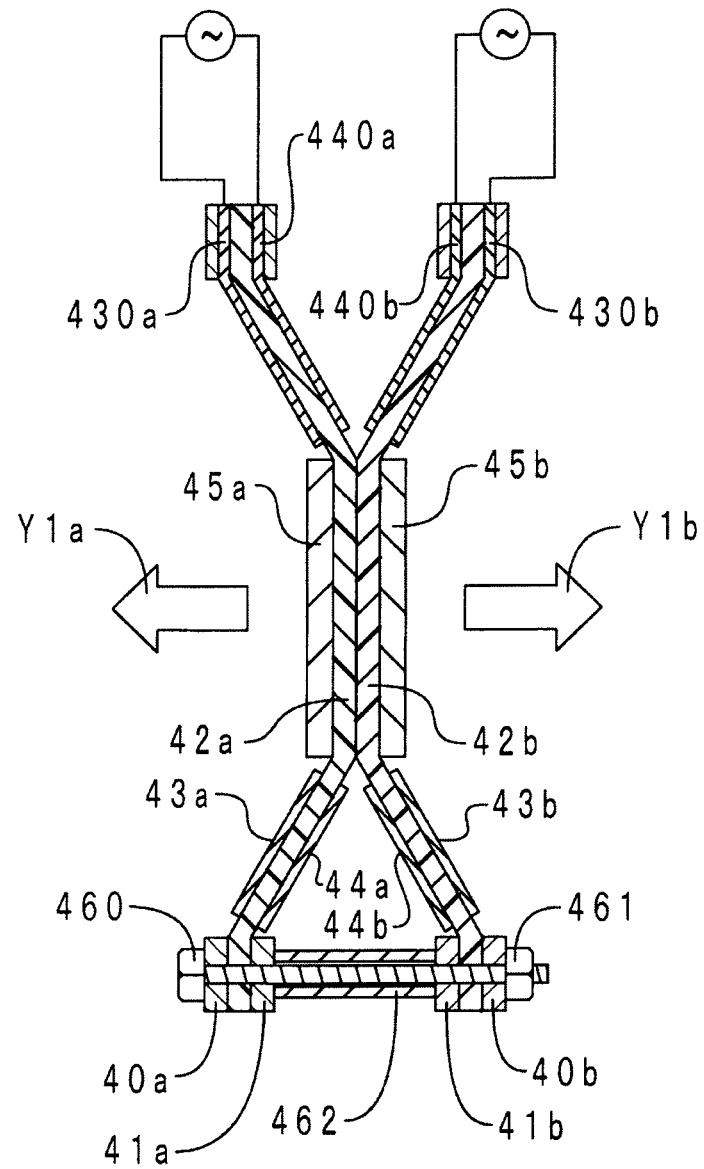
FIG. 6 is a cross-sectional view along a line VI-VI in FIG. 5.

As a fourth example of the transducer of the present invention, an embodiment of a speaker is described. First, the configuration of the speaker of the present embodiment is described. FIG. 5 is a perspective view of the speaker of the present embodiment. FIG. 6 is a cross-sectional view along a line VI-VI in FIG. 5. As shown in FIGS. 5 and 6, a speaker 4 is provided with a first outer frame 40a, a first inner frame 41a, a first dielectric film 42a, a first outer electrode 43a, a first inner electrode 44a, a first vibration plate 45a, a second outer frame 40b, a second inner frame 41b, a second dielectric film 42b, a second outer electrode 43b, a second inner electrode 44b, a second vibration plate 45b, eight bolts 460, eight nuts 461, and eight spacers 462.

The first outer frame 40a and first inner frame 41a are each made of resin and have a ring shape. The first dielectric film 42a is made of H-NBR and has a circular thin film shape. The first dielectric film 42a is spread out between the first outer frame 40a and the first inner frame 41a. Specifically, the first dielectric film 42a is held between and fixed in place by the first outer frame 40a on a front side and the first inner frame 41a on a back side, in a state ensuring a predetermined tensile force. The first vibration plate 45a is made of resin and has a round plate shape. The first vibration plate 45a has a diameter smaller than the first dielectric film 42a. The first vibration plate 45a is disposed in the approximate center of a front surface of the first dielectric film 42a.

The first outer electrode 43a has a ring shape. The first outer electrode 43a is glued to a front surface of the first dielectric film 42a. The first inner electrode 44a also has a ring shape. The first inner electrode 44a is glued to a back surface of the first dielectric film 42a. The first outer electrode 43a and the first inner electrode 44a are reversed in a front-back direction to one another with the first dielectric film 42a sandwiched therebetween. The first outer electrode 43a and the first inner electrode 44a are both configured with the flexible conductive material of the present invention. In addition, as shown in FIG. 6, the first outer electrode 43a is provided with a terminal 430a. The first inner electrode 44a is provided with a terminal 440a. Voltage is applied to the terminals 430a and 440a from the exterior.

The configuration, materials, and shapes of the second outer frame 40b, the second inner frame 41b, the second dielectric film 42b, the second outer electrode 43b, the second inner electrode 44b, and the second vibration plate 45b (hereafter, abbreviated as "the secondary components") are similar to the configuration, materials, and shapes of the first outer frame 40a, the first inner frame 41a, the first dielectric film 42a, the first outer electrode 43a, the first inner electrode 44a, and the first vibration plate 45a (hereafter, abbreviated as "the primary components"). In addition, the placement of the secondary components is symmetrical in the front-back direction with the placement of the primary components described above. Described simply, the second dielectric film 42b is made of H-NBR and is spread out between the second outer frame 40b and the second inner frame 41b. The second vibration plate 45b is disposed in the approximate center of the front surface of the second dielectric film 42b. The second outer electrode 43b is printed on a front surface of the second dielectric film 42b. The second inner electrode 44b is printed on a back surface of the second dielectric film 42b. The second outer electrode 43b and the second inner electrode 44b are both configured with the flexible conductive material of the present invention. Voltage is applied to a terminal 430b of the second outer electrode 43b and a terminal 440b of the second inner electrode 44b from the exterior.

The primary and secondary components are fixed in place by the eight bolts 460 and the eight nuts 461 via the eight spacers 462. The set of "bolt 460-nut 461-spacer 462" is disposed in a circumferential direction of the speaker 4 separated by predetermined intervals. The bolts 460 penetrate from the front surface of the first outer frame 40a to the front surface of the second outer frame 40b. The nuts 461 screw onto a through-end of the bolts 460. The spacers 462 are made of resin and encircle a shaft of the bolts 460. The spacers 462 ensure a predetermined gap between the first inner frame 41a and the second inner frame 41b. A back surface of a central portion of the first dielectric film 42a (back side of a portion where the first vibration plate 45a is disposed) and a back surface of a central portion of the second dielectric film 42b (back side of a portion where the second vibration plate 45b is disposed) are joined. Therefore, in a direction shown in FIG. 6 by a whited-out arrow Y1a, a biasing force builds up on the first dielectric film 42a. Also, in a direction shown in FIG. 6 by a whited-out arrow Y1b, a biasing force builds up on the second dielectric film 42b.

Next, movement of the speaker of the present embodiment is described. In an initial state (offset state), a predetermined voltage (offset voltage) is applied via the terminals 430a and 440a and the terminals 430b and 440b to the first outer electrode 43a and the first inner electrode 44a and to the second outer electrode 43b and the second inner electrode 44b. During operation of the speaker 4, voltage of the opposite phase is applied to the terminals 430a and 440a and to the terminals 430b and 440b. For example, when an offset voltage +1 V is applied to the terminals 430a and 440a, the film thickness within the first dielectric film 42a decreases for a portion disposed between the first outer electrode 43a and the first inner electrode 44a. In addition, the portion extends in a radial direction. Concurrently therewith, voltage of the opposite phase (offset voltage −1 V) is applied to the terminals 430b and 440b. The film thickness then increases for a portion within the second dielectric film 42b disposed between the second outer electrode 43b and the second inner electrode 44b. In addition, the portion contracts in a radial direction. Thus, while pulling the first dielectric film 42a, the second dielectric film 42b is elastically deformed by its own biasing force in the direction shown by the whited-out arrow Y1b in FIG. 6. In contrast, when the offset voltage +1 V is applied to the terminals 430b and 440b and the voltage of the opposite phase (offset voltage −1 V) is applied to the terminals 430a and 440a, while pulling the second dielectric film 42b, the first dielectric film 42a is elastically deformed by its own biasing force in the direction shown by the whited-out arrow Y1a in FIG. 6. In this way, the air is vibrated by vibrating the first vibration plate 45a and the second vibration plate 45b to produce sound.

Next, an operation effect of the speaker 4 of the present embodiment is described. According to the present embodiment, the first outer electrode 43a, the first inner electrode 44a, the second outer electrode 43b, and the second inner electrode 44b (hereafter, where appropriate, referred to as "electrodes 43a, 44a, 43b, and 44b") are flexible, extendable, and contractible. Therefore, the first outer electrode 43a and the first inner electrode 44a can extend and contract to follow deformation of the first dielectric film 42a. Similarly, the second outer electrode 43b and the second inner electrode 44b can extend and contract to follow the deformation of the second dielectric film 42b. That is, movement of the first dielectric film 42a and the second dielectric film 42b are less likely to be impeded by the electrodes 43a, 44a, 43b, and 44b.

In addition, according to the present embodiment, ionized impurities are unlikely to transfer from the first outer electrode 43a and the first inner electrode 44a to the first dielectric film 42a. Similarly, ionized impurities are unlikely to transfer from the second outer electrode 43b and the second inner electrode 44b to the second dielectric film 42b. Therefore, when voltage is applied, electric current is unlikely to flow through the first dielectric film 42a and the second dielectric film 42b. Accordingly, the possibility is small that physical properties of the first dielectric film 42a and the second dielectric film 42b will be changed and that the first dielectric film 42a and the second dielectric film 42b will break due to Joule heating. In this way, the speaker 4 has excellent durability.

<Flexible Wiring Board>

The flexible wiring board of the present invention is provided with an elastic base material and a wiring disposed on a front surface of the elastic base material. The material of the elastic base material is not particularly limited. Examples include, as materials having extendibility and contractibility, silicone rubber, ethylene-propylene copolymer rubber, natural rubber, styrene-butadiene copolymer rubber, acrylonitrile-butadiene rubber (NBR), acrylic rubber, epichlorohydrin rubber, chlorosulfonate polyethylene, chlorinated polyethylene, urethane rubber, fluorine rubber, chloroprene rubber, isobutylene isoprene rubber, and various kinds of thermoplastic elastomers.

At least a portion of the wiring is configured with the flexible conductive material of the present invention. The configuration of the flexible conductive material of the present invention and the manufacturing method thereof are as described above. Accordingly, their description is omitted here. In addition, in the flexible wiring board of the present invention, also, employing a favorable embodiment of the flexible conductive material of the present invention described above is preferred. The wiring may be formed with two or more conductive layers of different materials. In such a case, the conductive layer in contact with the elastic base material is preferably formed with the flexible conductive material of the present invention. Hereafter, an embodiment of the flexible wiring board of the present invention is described.

Figure 7:
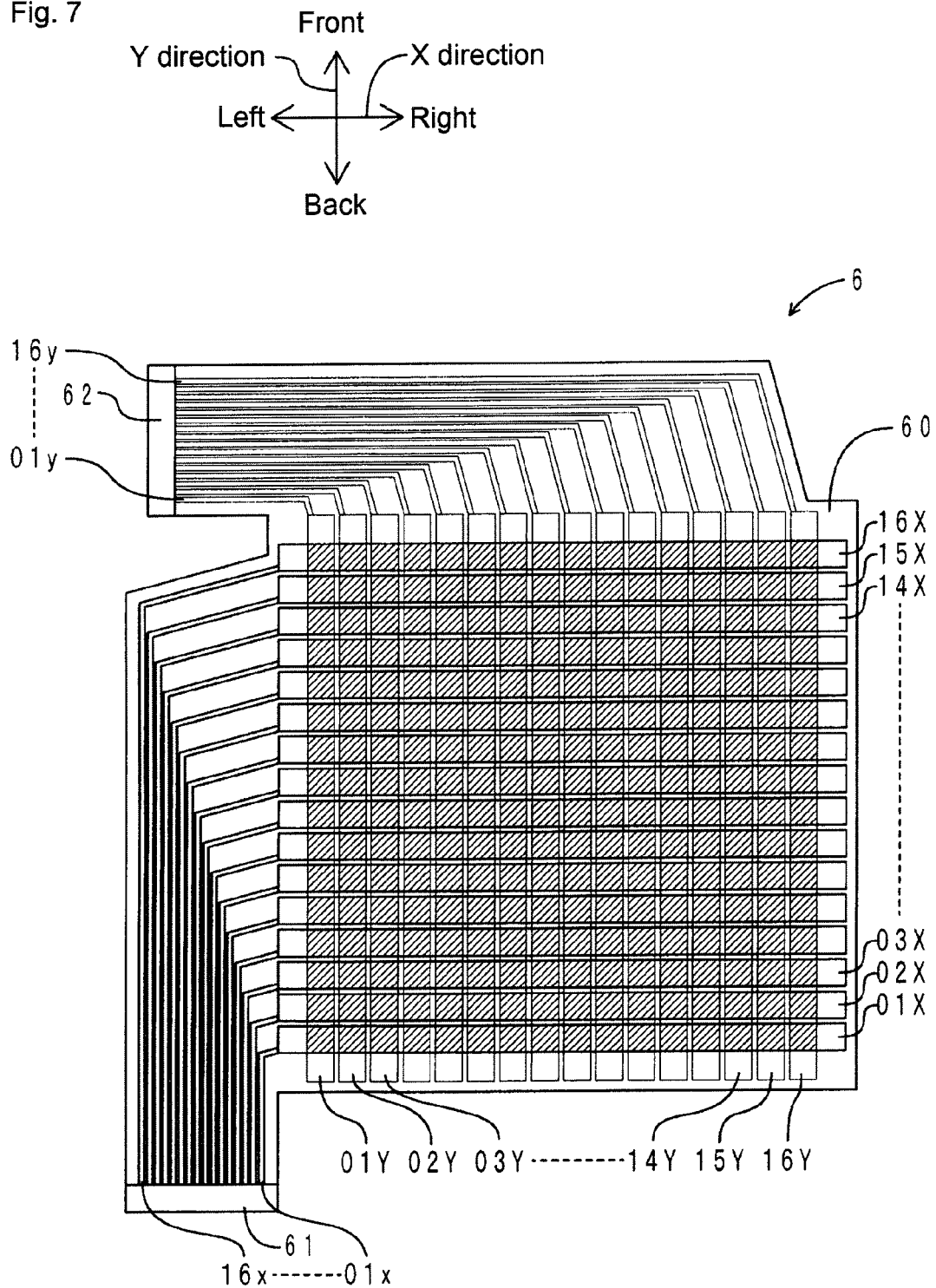
FIG. 7 is a transparent top view of a flexible wiring board of the present invention.

First, the configuration of the flexible wiring board of the present embodiment is described. FIG. 7 is a transparent top view of a flexible wiring board of the present embodiment. Moreover, in FIG. 7, electrodes and wirings on a back side are illustrated with thin lines. As shown in FIG. 7, a flexible wiring board 6 is provided with an elastic base material 60, front electrodes 01X-16X, back electrodes 01Y-16Y, front wirings 01x-16x, back wirings 01y-16y, a front wiring connector 61, and a back wiring connector 62.

The elastic base material 60 is made of urethane rubber and has a sheet shape. A total of sixteen front electrodes 01X-16X are disposed on an upper surface of the elastic base material 60. The front electrodes 01X-16X each have a belt shape. The front electrodes 01X-16X each extend in an X direction (left-right direction). The front electrodes 01X-16X are disposed so as to be spaced at a predetermined interval in a Y direction (front-back direction) and so as to be approximately parallel to one another. Similarly, a total of sixteen back electrodes 01Y-16Y are disposed on a lower surface of the elastic base material 60. The back electrodes 01Y-16Y each have a belt shape. The back electrodes 01Y-16Y each extend in the Y direction. The back electrodes 01Y-16Y are disposed so as to be spaced at a predetermined interval in the X direction and so as to be approximately parallel to one another. As shown by cross-hatching in FIG. 7, portions where the front electrodes 01X-16X and the back electrodes 01Y-16Y intersect with one another having the elastic base material 60 therebetween (overlapping portions) form detectors where a load and the like is detected.

A total of sixteen front wirings 01x-16x are disposed on the upper surface of the elastic base material 60. The front wirings 01x-16x each have a line shape. The front wirings 01x-16x are configured with the flexible conductive material of the present invention. The front wiring connector 61 is disposed in a left back corner of the elastic base material 60. The front wirings 01x-16x are each connected to the left ends of the front electrodes 01X-16X and to the front wiring connector 61. In addition, the upper surface of the elastic base material 60, the front electrodes 01X-16X, and the front wirings 01x-16x are covered from above by a front cover film (not shown).

A total of sixteen back wirings 01y-16y are disposed on the lower surface of the elastic base material 60. Each of the back wirings 01y-16y has a line shape. The back wirings 01y-16y are configured with the flexible conductive material of the present invention. The back wiring connector 62 is disposed in a left front corner of the elastic base material 60. The back wirings 01y-16y each connect a front end of the back electrodes 01Y-16Y and the back wiring connector 62. Further, the lower surface of the elastic base material 60, the back electrodes 01Y-16Y, and the back wirings 01y-16y are covered from below by a back cover film (not shown).

The front wiring connector 61 and the back wiring connector 62 are each electrically connected to an arithmetic portion (not shown). Impedance in the detector is input from the front wirings 01x-16x and the back wirings 01y-16y into the arithmetic portion. Based on this, surface pressure distribution is measured.

Next, an operation effect of the flexible wiring board 6 of the present embodiment is described. According to the present embodiment, the front wirings 01x-16x and the back wirings 01y-16y are each flexible, extendable, and contractible. Therefore, the front wirings 01x-16x and the back wirings 01y-16y can deform to follow the deformation of the elastic base material 60. Also, according to the present embodiment, ionized impurities are unlikely to transfer from the front wirings 01x-16x and the back wirings 01y-16y to the elastic base material 60. Therefore, the possibility is small that the electrical resistance of the elastic base material 60 will be reduced and that electric current will flow into the elastic base material 60. Accordingly, malfunctions are inhibited. Further, because electric current is unlikely to flow into the elastic base material 60, the possibility is small that the elastic base material 60 will break due to Joule heating. Therefore, the flexible wiring board 6 has excellent durability.

<Electromagnetic Shield>

The electromagnetic shield of the present invention is configured with the flexible conductive material of the present invention. The electromagnetic shield fulfills a role inhibiting electromagnetic waves generated within an electronic device from leaking to the exterior, and making it unlikely that electromagnetic waves from the exterior will intrude to the interior thereof. For example, in a case where the electromagnetic shield is disposed on an inner circumferential surface of a case for an electronic device, a coating material of the flexible conductive material of the present invention formed by dissolving a raw material such as rubber polymer in a predetermined solvent may be coated on the inner circumferential surface of the case for the electronic device and may then be cross-linked. Also, the electromagnetic shield can be disposed in the capacitance-type sensor shown as the second embodiment of the transducer described above. For example, the electromagnetic shield may be disposed so as to coat each of a top surface of the cover film 23a and a bottom surface of the cover film 23b (see FIGS. 2 and 3, mentioned previously). In such a case, the coating material for the flexible conductive material of the present invention may be coated on the top surface of the cover film 23a and the bottom surface of the cover film 23b and may then be cross-linked. Moreover, when disposed as a gasket in gaps in the electronic device, the flexible conductive material of the present invention may be molded into a desired shape and then employed.

Working Example

Next, the present invention will be more concretely described by giving working examples.

Manufacture of Flexible Conductive Material

Examples 1-8

The flexible conductive material of examples 1-8 was produced from the raw materials shown in Tables 1 and 2, below. First, an acrylic rubber polymer containing an epoxy group ("Nipol (registered trademark) AR42W" manufactured by Zeon Corporation), zinc dimethyldithiocarbamate ("Nocceler (registered trademark) PZ" manufactured by Ouchi Shinko Chemical Industrial) as a vulcanization accelerator, and ferric dimethyldithiocarbamate ("Nocceler TTFE" manufactured by Ouchi Shinko Chemical Industrial) were mixed by a roll kneader. Next, the obtained mixture was dissolved in methyl ethyl ketone (MEK). Then, a conductive agent ("Ketjen Black (registered trademark) EC-600JD" manufactured by Lion Corporation) was added to the MEK solution and agitated by a dyno mill. Then, a predetermined adsorbent was added to the agitated MEK solution and was processed for five minutes in an ultrasonic homogenizer. A rubber composition was prepared thereby. Next, the prepared rubber composition was coated on a base material with a bar coating method to form a coating film with a thickness of approximately 20 μm. Then, after being dried, the coating film was heated for 30 minutes at 170° C. to advance a cross-linking reaction. In this way, the flexible conductive material of examples 1-8 was produced.

Example 9

The flexible conductive material of example 9 was produced as described above except that the conductive agent was changed to silver powder ("FA-D-4" manufactured by DOWA Electronics Materials Co. Ltd.).

Example 10

The flexible conductive material of example 10 was produced by changing the elastomer to a thermoplastic urethane elastomer. First, the thermoplastic urethane elastomer ("Nippolan (registered trademark) 5193" manufactured by Nippon Polyurethane Industry Co. Ltd.) was dissolved in MEK. Then, the conductive agent (Ketjen Black (same as above)) was added to the MEK solution and agitated by the dyno mill. Then, the adsorbent (activated carbon) was added to the agitated MEK solution and processed for 5 minutes in the ultrasonic homogenizer. The rubber composition was prepared thereby. Next, the prepared rubber composition was coated on a base material with the bar coating method to form a coating film with a thickness of approximately 20 μm. Then, after being dried, the coating film was heated for 30 minutes at 150° C. to harden. In this way, the flexible conductive material of example 10 was produced.

Examples 12 and 13

The flexible conductive material of examples 12 and 13 was produced similarly to the flexible conductive material of examples 1-8 except that activated carbon or mesoporous carbon having conductivity was included as an adsorbent and the conductive agent Ketjen Black was not included. In the flexible conductive material of examples 12 and 13, the activated carbon or mesoporous carbon added as an adsorbent fulfilled the role of the conductive agent.

Example 14

The flexible conductive material of example 14 was produced similarly to example 9 described above, except that the included amount of silver powder in the conductive agent was changed and a vulcanization accelerator was not included.

Comparative Example 1

The flexible conductive material of comparative example 1 was produced similarly to the flexible conductive material of examples 1-8, except that an adsorbent was not included.

Comparative Example 2

The flexible conductive material of comparative example 2 was produced similarly to the flexible conductive material of example 9, except that an adsorbent was not included.

Comparative Example 3

The flexible conductive material of comparative example 3 was produced similarly to the flexible conductive material of example 14, except that an adsorbent was not included.

Manufacture of Conductive Laminate Body

Example 11

First, the rubber composition prior to cross-linking in the manufacturing process of the flexible conductive material of example 7 was coated onto a base material by the bar coating method to form a coating film having a thickness of approximately 20 μm. Next, the rubber composition prior to cross-linking in the manufacturing process of the flexible conductive material of comparative example 2 was coated onto a top surface of the formed coating film with the bar coating method to form a coating film having a thickness of approximately 20 μm. Then, by heating for 30 minutes at 170° C., the two laminated layers of coating film were vulcanization-bonded. In this way, a conductive laminate body of example 11 was produced.

Tables 1 and 2 show the type and included amount of raw materials used. In Table 1, a fumed silica "Aerosil (registered trademark) 380" manufactured by Nippon Aerosil Co. Ltd. (pH 3.7-4.7, specific surface area 380 m$^2$/g) was used as a silica. Also, "Dowex (registered trademark) 50Wx8 200-400" manufactured by Dow Chemical Company was used as an H positive ion-exchange resin. In Table 2, "YP-50F" manufactured by Kuraray Chemical Co. Ltd. was used as an activated carbon. Also, "Carbon, mesoporous, graphitized, nanopowder" manufactured by Sigma-Aldrich Corporation was used as a mesoporous carbon.

TABLE 1

| | Ingredient (parts by mass) | | Example 1 | Ex. 2 | Ex. 3 | Ex. 4 | Ex. 5 | Ex. 6 | Comparative Ex. 1 |
|---|---|---|---|---|---|---|---|---|---|
| Elastomer | Acrylic rubber polymer containing epoxy group | | 100 | 100 | 100 | 100 | 100 | 100 | 100 |
| Conductive agent | Ketjen black | | 10 | 10 | 15 | 10 | 10 | 15 | 10 |
| Adsorbent | Trimercaptotriazine (TMT) | | 10 | 20 | 10 | — | — | — | — |
| | Silica | | — | — | — | 10 | 20 | — | — |
| | H positive ion-exchange resin | | — | — | — | — | — | 10 | — |
| Vulcanization accelerator | Zinc dimethyldithiocarbamate | | 2.5 | 2.5 | 2.5 | 2.5 | 2.5 | 2.5 | 2.5 |
| | Ferric dimethyldithiocarbamate | | 0.5 | 0.5 | 0.5 | 0.5 | 0.5 | 0.5 | 0.5 |
| Evaluation results | Cross-linkability | MEK insoluble [%] | — | — | 95.9 | — | — | — | 66.7 |
| | Tensile properties | Elasticity [MPa] | 1.24 | 1.79 | 7.93 | 3.49 | 10.0 | 4.38 | 2.21 |
| | | $M_{25}$ [MPa] | 0.32 | 0.38 | 1.67 | 0.58 | 1.58 | 0.86 | 0.35 |
| | Conductivity | Volume resistivity [Ω · cm] | $4.2 \times 10^1$ | $1.9 \times 10^1$ | — | $5.0 \times 10^0$ | $5.3 \times 10^0$ | — | $7.3 \times 10^0$ |
| | Effect on an adherend | Leakage current at electrical field strength 10 V/μm [μA] | 7 | — | 5 | 22 | 16 | 5 | 34 |
| | | Leakage current at electrical field strength 20 V/μm [μA] | 8 | — | 6 | 29 | 23 | 5 | 44 |
| | | Leakage current at electrical field strength 30 V/μm [μA] | 9 | — | 6 | 36 | 26 | 9 | (Electric breakdown) |
| | | Leakage current at electrical field strength 20 V/μm after 1 month dormancy in highly humid environment [μA] | 9 | — | 6 | 32 | 24 | 6 | 60 |

TABLE 2

| Ingredient (parts by mass) | | Ex. 7 | Ex. 8 | Ex. 9 | Ex. 10 | Ex. 11 |
|---|---|---|---|---|---|---|
| Elastomer | Acrylic rubber polymer containing epoxy group | 100 | 100 | 100 | — | Laminate body of Ex. 7 and Comparative example 2 |
| | Thermoplastic urethane elastomer | — | — | — | 100 | |
| Conductive agent | Ketjen black | 10 | 10 | — | 10 | |
| | Silver powder | — | — | 500 | — | |
| Adsorbent | Activated carbon | 10 | — | 3 | 10 | |
| | Mesoporous carbon | — | 10 | — | — | |
| Vulcanization accelerator | Zinc dimethyldithiocarbamate | 2.5 | 2.5 | 2.5 | — | |
| | Ferric dimethyldithiocarbamate | 0.5 | 0.5 | 0.5 | — | |
| Evaluation results | Tensile properties Elasticity [MPa] | 1.92 | 0.87 | 5.97 | 9.45 | 6.31 |
| | $M_{25}$ [MPa] | 0.36 | 0.19 | 0.42 | 3.30 | 0.80 |
| | Conductivity Volume resistivity [Ω·cm] | $4.0 \times 10^{0}$ | $6.0 \times 10^{0}$ | $1.0 \times 10^{-4}$ | $7.0 \times 10^{1}$ | $8.0 \times 10^{-4}$ |
| | Effect on an adherend Leakage current at electrical field strength 10 V/μm [μA] | 3 | 3 | 3 | 2 | 5 |
| | Leakage current at electrical field strength 20 V/μm [μA] | 3 | 5 | 4 | 2 | 5 |
| | Leakage current at electrical field strength 30 V/μm [μA] | 4 | 5 | 8 | 3 | 6 |
| | Leakage current at electrical field strength 20 V/μm after 1 month dormancy in highly humid environment [μA] | 3 | 6 | 5 | 2 | 5 |

| Ingredient (parts by mass) | | Ex. 12 | Ex. 13 | Ex. 14 | Comparative Ex. 2 | Comparative Ex. 3 |
|---|---|---|---|---|---|---|
| Elastomer | Acrylic rubber polymer containing epoxy group | 100 | 100 | 100 | 100 | 100 |
| | Thermoplastic urethane elastomer | — | — | — | — | — |
| Conductive agent | Ketjen black | — | — | — | — | — |
| | Silver powder | — | — | 300 | 500 | 300 |
| Adsorbent | Activated carbon | 30 | — | 5 | — | — |
| | Mesoporous carbon | — | 30 | — | — | — |
| Vulcanization accelerator | Zinc dimethyldithiocarbamate | 2.5 | 2.5 | — | 2.5 | — |
| | Ferric dimethyldithiocarbamate | 0.5 | 0.5 | — | 0.5 | — |
| Evaluation results | Tensile properties Elasticity [MPa] | 7.01 | 0.88 | 1.30 | 1.88 | 1.23 |
| | $M_{25}$ [MPa] | 1.32 | 0.22 | 0.23 | 0.28 | 0.20 |
| | Conductivity Volume resistivity [Ω·cm] | $5.0 \times 10^{1}$ | $2.0 \times 10^{1}$ | $6.0 \times 10^{-4}$ | $4.0 \times 10^{-4}$ | $6.0 \times 10^{-4}$ |
| | Effect on an adherend Leakage current at electrical field strength 10 V/μm [μA] | 1 | 1 | 2 | 25 | 8 |
| | Leakage current at electrical field strength 20 V/μm [μA] | 3 | 2 | 3 | 32 | 14 |
| | Leakage current at electrical field strength 30 V/μm [μA] | 3 | 3 | 5 | 55 | 28 |
| | Leakage current at electrical field strength 20 V/μm after 1 month dormancy in highly humid environment [μA] | 3 | 3 | 4 | 85 | 68 |

For the flexible conductive material of the examples and comparative examples, as well as for the conductive laminate body of example 11, tensile properties, conductivity, and effect on an adherend were evaluated. In addition, for the flexible conductive material of example 3 and comparative example 1, cross-linkability was also evaluated. Below, each evaluation method and evaluation result is described.

Evaluation Method (Cross-Linkability)

For the flexible conductive material of example 3 and comparative example 1, the degree of advancement in cross-linking was measured. First, 1 g of a test sample prepared from each flexible conductive material was immersed in 30 g of MEK. After dormancy therein for 4 hours at room temperature, the test sample was extracted and dried. Then, the mass of the test sample after drying was measured and a ratio of dried mass to initial mass (MEK insoluble) was calculated.

(Tensile Properties)

For the flexible conductive material of the examples and comparative examples, as well as for the conductive laminate body of example 11, an elastic modulus was calculated from stress-extension curves in a tensile test according to JIS K7127 (1999). The shape of the test sample was a Type 2 test sample. Also, the tensile stress (M25) during 25% extension of the above flexible conductive materials and conductive laminate body was measured according to JIS K 6251 (2004). The shape of the test sample was Dumbbell No. 5-shaped.

(Conductivity)

For the flexible conductive material of the examples and comparative examples, as well as for the conductive laminate body of example 11, volume resistivity was measured according to a parallel terminal electrode method in JIS K6271 (2008). During measurement, a commercially available butyl rubber sheet (manufactured by Tigers Polymer Corporation) was used as an insulating resin support tool supporting the flexible conductive material and the like (test sample).

(Effect on an Adherend)

(1) Preparation of Elements for Testing

A dielectric film for an adherend was prepared as follows. First, a hydrogenated nitrile rubber containing a carboxyl group ("Therban (registered trademark) XT8889" manufactured by Lanxess AG) was dissolved in acetyl acetone. Next, tetrakis(2-ethylhexyloxy)titanium was added to the solution and mixed. Then, the obtained mixed solution was coated on a base material with the bar coating method and dried to form a coating film with a thickness of 18 μm. The coating film was cut in a rectangular shape of 50 mm in length and 25 mm in width to make a pre-cross-linking dielectric film.

Meanwhile, in the manufacturing process described above for the flexible conductive material, the coating film of the rubber composition prior to cross-linking was cut in a rectangular shape of 38 mm in length and 20 mm in width to make a pre-cross-linking electrode. Then, one pre-cross-linking electrode was disposed on each of the front and back surfaces of the pre-cross-linking dielectric film. Then, by heating for 30 minutes at 170° C., the dielectric film and the electrodes were vulcanization-bonded. In this way, a first element for testing was produced.

Also, the two layers of coating film in the manufacturing process of the conductive laminate body of example 11 (the coating film of example 7/the coating film of comparative example 2) were cut in a rectangular shape of 38 mm in length and 20 mm in width to make a pre-cross-linking electrode. Then, one pre-cross-linking electrode was disposed on each of the front and back surfaces of the pre-cross-linking dielectric film. Then, by heating for 30 minutes at 170° C., the dielectric film and the electrodes were vulcanization-bonded. The pre-cross-linking electrodes were each disposed such that the coating film of example 7 was in contact with the pre-cross-linking dielectric film. In this way, a second element for testing was produced.

(2) Measurement of Leakage Current

Figure 8:
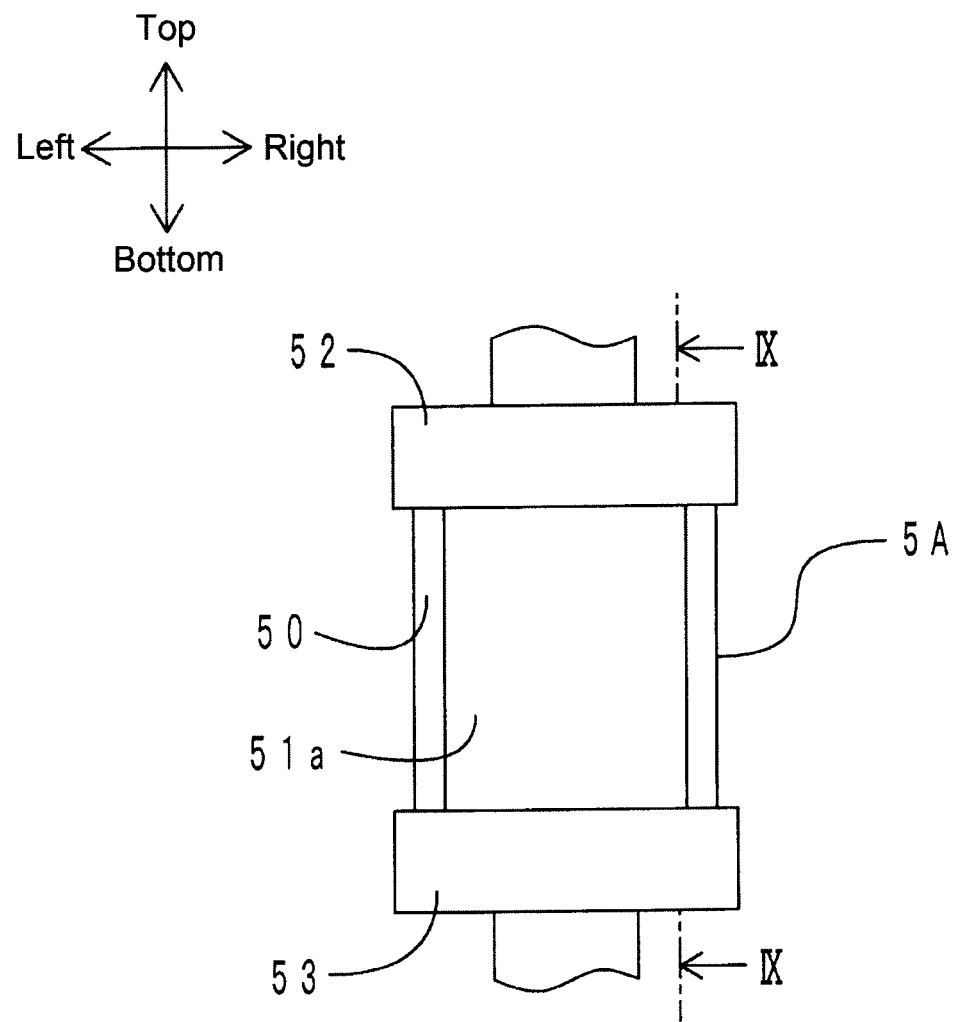
FIG. 8 is front view of an obverse side of a first element for testing mounted in a measurement device.
Figure 9:
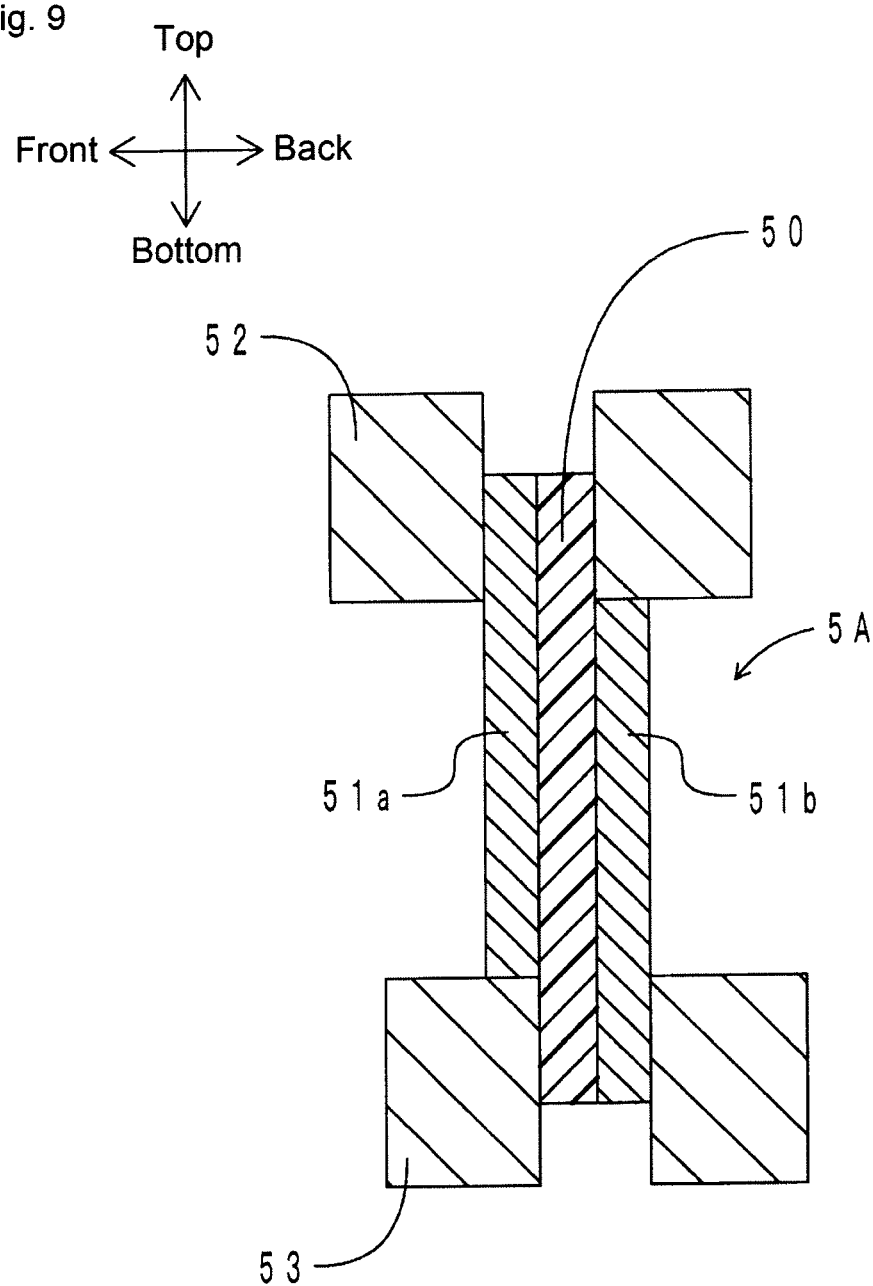
FIG. 9 is a cross-sectional view along a line IX-IX in FIG. 8.

The two kinds of elements for testing prepared were each set on a testing device and electric current flowing through the dielectric film (adherend) during application of voltage was measured. First, a method for measuring leakage current in the first element for testing is described. FIG. 8 is a front view of an obverse side of the first element for testing mounted in the testing device. FIG. 9 is a cross-sectional view along a line IX-IX in FIG. 8.

As shown in FIGS. 8 and 9, a top edge of a first element for testing 5A was gripped by an upper chuck 52 in the testing device. A bottom edge of the first element for testing 5A was gripped by a lower chuck 53. The first element for testing 5A, the upper chuck 52, and the lower chuck 53 were each insulated. The first element for testing 5A was mounted between the upper chuck 52 and the lower chuck 53 in a state pre-extended in an up-down direction (extension ratio of 25%).

The first element for testing 5A was configured with a dielectric film 50 and a pair of electrodes 51a and 51b. The electrodes 51a and 51b were disposed opposite one another in a front-back direction with the dielectric film 50 sandwiched therebetween. The electrodes 51a and 51b were disposed in a state offset by 8 mm in the up-down direction. That is, the electrodes 51a and 51b overlapped across the dielectric film 50 within a range of 30 mm in length and 20 mm in width. A wiring (not shown) was connected to a bottom end of the electrode 51a. Similarly, a wiring (not shown) was connected to a top end of the electrode 51b. The electrodes 51a and 51b were connected to a power source (not shown) via their respective wirings.

When voltage was applied between the electrodes 51a and 51b, an electrostatic attraction was generated therebetween and the dielectric film 50 was compressed. Accordingly, the thickness of the dielectric film 50 decreased and extended in an extension direction (up-down direction). Direct current voltage having an electric field strength of 10, 20, or 30 V/μm was applied in order, then the value of electric current flowing between the electrodes 51a and 51b was measured.

Figure 10:
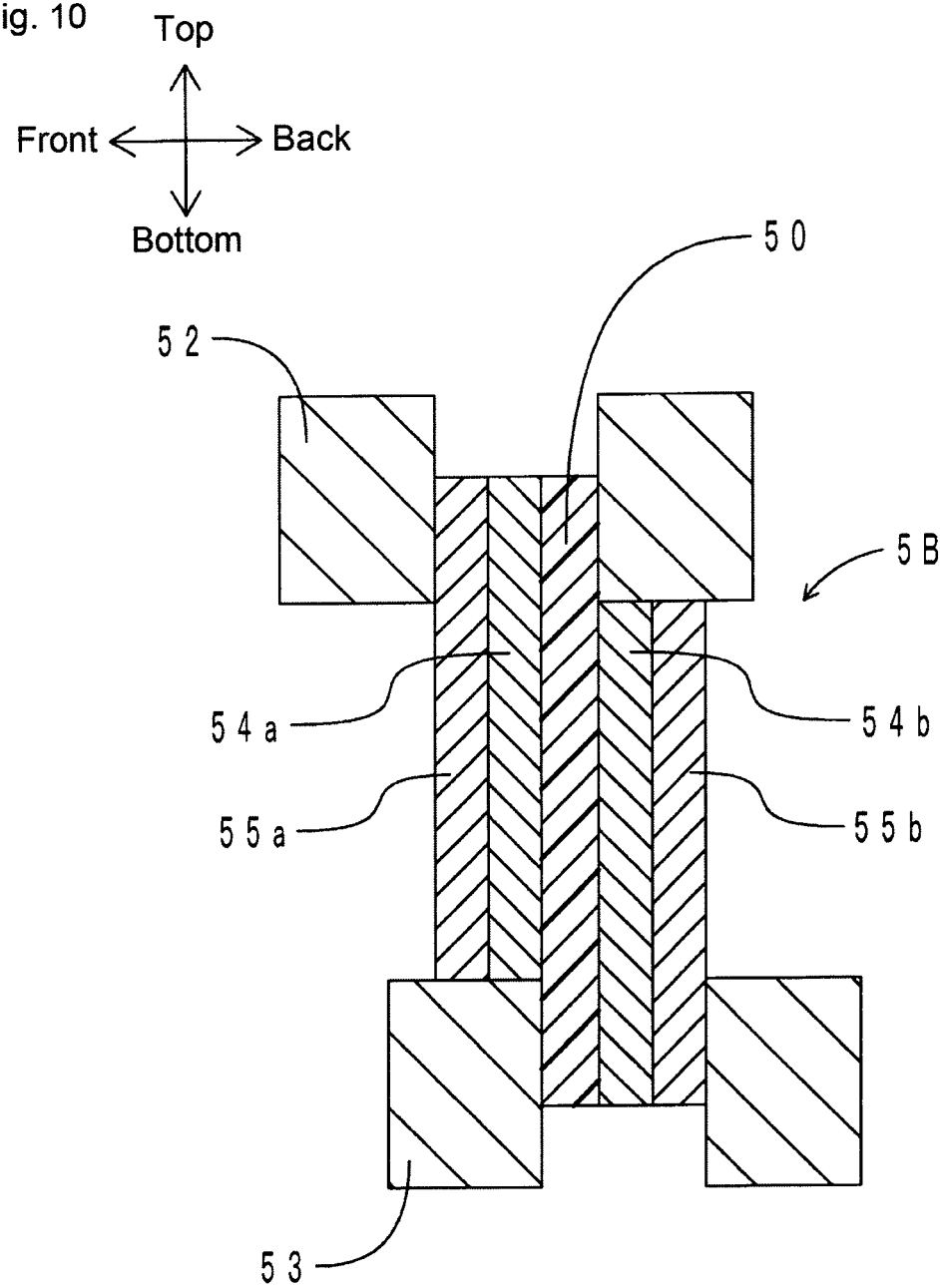
FIG. 10 is a cross-sectional view of a second element for testing mounted in a testing device.

Next, a method for measuring leakage current in the second element for testing is described. FIG. 10 is a cross-sectional view of the second element for testing mounted in the testing device. FIG. 10 corresponds to FIG. 9. Accordingly, components in FIG. 10 which correspond to those in FIG. 9 are shown with the same reference numbers.

As shown in FIG. 10, a top end of a second element for testing 5B was gripped by the upper chuck 52 in the testing device. A bottom end of the second element for testing 5B was gripped by the lower chuck 53. The second element for testing 5B, the upper chuck 52, and the lower chuck 53 were each insulated. The second element for testing 5B was mounted between the upper chuck 52 and the lower chuck 53 in a state pre-extended in the up-down direction (extension ratio of 25%).

The second element for testing 5B was configured with the dielectric film 50, a pair of inner electrodes 54a and 54b, and a pair of outer electrodes 55a and 55b. The inner electrodes 54a and 54b were configured with the flexible conductive material of example 7. The inner electrodes 54a and 54b were disposed opposite one another in a front-back direction with the dielectric film 50 sandwiched therebetween. The inner electrodes 54a and 54b were disposed in a state offset by 8 mm in the up-down direction. That is, the inner electrodes 54a and 54b overlapped across the dielectric film 50 in a range of 30 mm in length and 20 mm in width. The outer electrodes 55a and 55b were configured with the flexible conductive material of comparative example 2. The outer electrode 55a was laminated on a front surface of the inner electrode 54a. The outer electrode 55b was laminated on a back surface of the inner electrode 54b. A bottom end of the outer electrode 55a was connected to a wiring (not shown). Similarly, a top end of the outer electrode 55b was connected to a wiring (not shown). The outer electrodes 55a and 55b were connected to a power source (not shown) via their respective wirings. Direct current voltage having an electric field strength of 10, 20, or 30 V/μm was applied in order to the outer electrodes 55a and 55b, then the value of electric current flowing between the outer electrodes 55a and 55b was measured.

Moreover, the first element for testing 5A and the second element for testing 5B were left dormant for one month in an environment of 40° C. in temperature and 95% humidity. Thereafter, with each of the measurement methods described above, direct current voltage having an electric field strength of 20 V/μm was applied and the value of electric current flowing between the electrodes was measured.

Evaluation Results

The results of the evaluation are collectively shown in Tables 1 and 2 above. As shown in Table 1, the MEK insoluble in the flexible conductive material of example 3 in which trimercaptotriazine (TMT) has been included has a value near 100%. Compared to an MEK insoluble in the flexible conductive material of comparative example 1 in which TMT has not been included, this value is considerably larger. In this way, in the flexible conductive material of example 3 in which TMT has been included, an improvement in cross-linking density has been confirmed.

As shown in Tables 1 and 2, an elastic modulus becomes larger in accordance with an increase in the included amount of an adsorbent and a conductive agent. Also, the flexible conductive material of examples 1, 2, 4, 5, 7, 8, 10, 12, and 13, show high conductivity to a similar degree to the flexible conductive material of comparative example 1, and the flexible conductive material of examples 9 and 14 and the conductive laminate body of example 11, show high conductivity to a similar degree to the flexible conductive material of comparative example 2.

In addition, as a result of a test of conduction by an element for testing, when the flexible conductive material of comparative example 1 is made into an electrode, leakage current is high and, at an electric field strength of 30 V/μm, the dielectric film experiences electric breakdown. Similarly, in a case where the flexible conductive material of comparative example 2 is made into an electrode, as well, leakage current became large particularly at an electric field strength of 30 V/μm. Furthermore, no vulcanization accelerator is included in the flexible conductive material of comparative example 3. Thus, in a case where the flexible conductive material of comparative example 3 is made into an electrode, leakage current is lower than the other comparative examples where a vulcanization accelerator was included. However, after leaving the elements for testing dormant for one month in a high humidity environment, leakage current became large, similar to the other comparative examples. In conjunction with the passage of time, this may be considered to be due to ionized impurities transferring from the flexible conductive material to the dielectric film. In the flexible conductive material of comparative example 3 where no vulcanization accelerator was included, the silver of the conductive agent may have ionized and transferred to the dielectric film.

In contrast, leakage current is small when the flexible conductive material of the examples is made into an electrode. Of these, leakage current is small when the flexible conductive material of examples 7-10, 12, and 13, which used activated carbon or mesoporous carbon as an adsorbent, is made into an electrode. In addition, leakage current is also small in a case where the conductive laminate body of example 11, in which the flexible conductive material of example 7 and the flexible conductive material of comparative example 2 are laminated, is made into an electrode. Also, in a case where the elements for testing were left dormant for a month in a high humidity environment, leakage current did not change much in all of the examples.

An adsorbent is included in the flexible conductive material of the examples. Therefore, impurity ions such as reaction residue left within an elastomer and silver ions in which silver of the conductive agent has ionized are adsorbed and fixed in the adsorbent. Accordingly, the impurities transferring from the flexible conductive material (electrode) to the dielectric film are reduced and a reduction in electrical resistance of the dielectric film may be inhibited. For example, when comparing examples 4 and 5 of the flexible conductive material in which silica is included, leakage current becomes smaller accompanying an increase in an included amount of silica. This may be considered to be due to an adsorbed amount of impurity ions increasing when the content amount of silica becomes greater, and additionally due to the impurity ions themselves becoming unlikely to transfer.

INDUSTRIAL APPLICABILITY

The flexible conductive material of the present invention is favorable as a material for electrodes and wiring of a flexible transducer using an elastomer. The flexible conductive material of the present invention is also favorable as a wiring material for a flexible wiring board used in control of movable components for robots and industrial machinery, in wearable devices, in bendable displays, and the like. Moreover, the flexible conductive material of the present invention is also favorable as an electromagnetic shield.

The invention claimed is:

1. A transducer comprising:
a dielectric film;
a plurality of electrodes disposed across the dielectric film; and
a wiring connecting each of the plurality of electrodes, wherein
at least one of the electrodes and the wiring comprise a flexible conductive material comprising:
an elastomer made by cross-linking a rubber compound;
a conductive agent filled in the elastomer; and
an adsorbent fixed inside the elastomer and able to adsorb ionic material, wherein the adsorbent is at least one kind selected from the group consisting of: a compound having a mercapto group in an amount of 10-20 parts by mass per 100 parts by mass of elastomer; an ion-exchange polymer in an amount of 1-30 parts by mass per 100 parts by mass of elastomer; an activated carbon in an amount of 1-20 parts by mass per 100 parts by mass of elastomer; a silica; and a mesoporous carbon.

2. The transducer according to claim 1, wherein the adsorbent is a compound having a mercapto group, which is chemically bonded to the elastomer.

3. The transducer according to claim 1, wherein the adsorbent is a compound having a mercapto group, which has a triazine skeleton.

4. The transducer according to claim 1, wherein the adsorbent is a compound having a mercapto group, which contains trimercaptotriazine.

5. The transducer according to claim 1, wherein the adsorbent is an ion-exchange polymer, which is one of an H positive ion-exchange polymer and an OH negative ion-exchange resin.

6. The transducer according claim 1, wherein the conductive agent contains at least one of carbon black and silver particles.

7. The transducer according to claim 1, wherein the conductive agent and the adsorbent are at least one of activated carbon and mesoporous carbon.

8. The transducer according to claim 1, wherein, after being left dormant for one month in a highly humid environment of 40° C. in temperature and 95% humidity, when a voltage having an electric field strength of 20 V/μm was applied to the transducer, the electric current flowing is 32 μA or less.

9. The transducer according to claim 1, wherein:
at least one of the electrodes includes a laminated plurality of conductive layers, and
of the plurality of conductive layers, at least the inner conductive layer in contact with the dielectric film comprises the flexible conductive material.

10. The transducer according to claim 1, wherein the adsorbent is a compound having a mercapto group, in an amount of 10-20 parts by mass per 100 parts by mass of elastomer.

11. The transducer according to claim 1, wherein the adsorbent is an ion-exchange polymer, in an amount of 1-30 parts by mass per 100 parts by mass of elastomer.

12. The transducer according to claim 1, wherein the adsorbent is a silica.

13. The transducer according to claim 1, wherein the adsorbent is an activated carbon in an amount of 1-20 parts by mass per 100 parts by mass of elastomer.

14. The transducer according to claim 1, wherein the adsorbent is a mesoporous carbon.

* * * * *